US012594831B2

(12) United States Patent
Yu et al.

(10) Patent No.: US 12,594,831 B2
(45) Date of Patent: Apr. 7, 2026

(54) DISPLAY DEVICE AND VEHICLE

(71) Applicants: Chengdu BOE Optoelectronics Technology Co., Ltd., Sichuan (CN); BOE Technology Group Co., Ltd., Beijing (CN)

(72) Inventors: Zhengmao Yu, Beijing (CN); Fei Li, Beijing (CN); Shanghong Li, Beijing (CN); Qi Huang, Beijing (CN); Yudan Shui, Beijing (CN); Xing Huang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 209 days.

(21) Appl. No.: 18/563,748

(22) PCT Filed: Feb. 21, 2023

(86) PCT No.: PCT/CN2023/077421
§ 371 (c)(1),
(2) Date: Nov. 22, 2023

(87) PCT Pub. No.: WO2024/174090
PCT Pub. Date: Aug. 29, 2024

(65) Prior Publication Data
US 2024/0300331 A1     Sep. 12, 2024

(51) Int. Cl.
B60K 35/22      (2024.01)
H02K 11/00      (2016.01)
(Continued)

(52) U.S. Cl.
CPC ........ B60K 35/223 (2024.01); H02K 11/0094 (2013.01); H05K 5/02 (2013.01); B60K 2360/151 (2024.01); H10K 59/87 (2023.02)

(58) Field of Classification Search
CPC ............ B60K 35/223; B60K 2360/151; H02K 11/0094; H10K 59/87
See application file for complete search history.

(56) References Cited

U.S. PATENT DOCUMENTS

2016/0312514 A1* 10/2016 Leonard .............. F16H 25/2454
2018/0011518 A1* 1/2018 Choi ........................ H04N 5/64
(Continued)

FOREIGN PATENT DOCUMENTS

CN     201995052 U     9/2011
CN     110362155 A     10/2019
(Continued)

OTHER PUBLICATIONS

Machine Translation for KR20140064146A (Year: 2025).*
Machine Translation for CN113870708A (Year: 2025).*

*Primary Examiner* — Sagar Shrestha
*Assistant Examiner* — Peter Krim
(74) *Attorney, Agent, or Firm* — IPro, PLLC

(57) ABSTRACT

Provided is a display device. The display device includes: a display module, having a bendable display region and a planar display region; an encapsulation housing, disposed on a non-display side of the display module, wherein a receiving chamber is formed between the encapsulation housing and the non-display side of the display module; and at least one support assembly, disposed in the receiving chamber, wherein the support assembly at least comprises a first retractable linkage and a first drive motor, a first end of the first retractable linkage is connected to the encapsulation housing, and a second end of the first retractable linkage is connected to the non-display side of the display module.

18 Claims, 13 Drawing Sheets

(51) Int. Cl.
    *H05K 5/02*        (2006.01)
    *H10K 59/80*        (2023.01)

(56)          References Cited

U.S. PATENT DOCUMENTS

| | | | |
|---|---|---|---|
| 2019/0098775 A1* | 3/2019 | Cho | H05K 5/03 |
| 2019/0138054 A1* | 5/2019 | Alva | G06F 1/1624 |
| 2020/0201394 A1* | 6/2020 | Choi | G09F 9/301 |
| 2021/0151697 A1 | 5/2021 | Cao et al. | |
| 2023/0043205 A1* | 2/2023 | Gross | B60K 35/22 |
| 2023/0049246 A1 | 2/2023 | Wang et al. | |
| 2024/0012453 A1 | 1/2024 | Gwak et al. | |

FOREIGN PATENT DOCUMENTS

| | | | | |
|---|---|---|---|---|
| CN | 110588525 A | 12/2019 | | |
| CN | 110689813 A | 1/2020 | | |
| CN | 210627726 U | 5/2020 | | |
| CN | 112037662 A | 12/2020 | | |
| CN | 112071207 A | 12/2020 | | |
| CN | 112164322 A | 1/2021 | | |
| CN | 212570232 U | 2/2021 | | |
| CN | 112509466 A | 3/2021 | | |
| CN | 112908171 A | 6/2021 | | |
| CN | 113129756 A | 7/2021 | | |
| CN | 113870708 A | * 12/2021 | | H10K 59/80 |
| CN | 114078362 A | 2/2022 | | |
| CN | 114220351 A | 3/2022 | | |
| CN | 114446171 A | 5/2022 | | |
| CN | 114927065 A | 8/2022 | | |
| CN | 114980638 A | 8/2022 | | |
| CN | 115482741 A | 12/2022 | | |
| JP | 2011128192 A | 6/2011 | | |
| KR | 20140064146 A | * 5/2014 | | G09F 9/35 |
| WO | 2022055185 A1 | 3/2022 | | |

\* cited by examiner

DISPLAY DEVICE AND VEHICLE

CROSS-REFERENCE TO RELATED APPLICATION

This application is a U.S. national phase application based on PCT/CN2023/077421, filed on Feb. 21, 2023, the disclosure of which is incorporated herein by reference in its entirety.

TECHNICAL FIELD

The present disclosure related the field of display technology, and in particular to a display device and a vehicle.

BACKGROUND

Organic light emitting diode (OLED) display panels can be applied in folded display modules due to their better bending performance.

SUMMARY

Embodiments of the present disclosure provide a display device and a vehicle. The technical solutions are described as follows.

According to some embodiments of the present disclosure, a display device is provided. The display device includes:

a display module, having a bendable display region and a planar display region;

an encapsulation housing, disposed on a non-display side of the display module, wherein a receiving chamber is formed between the encapsulation housing and the non-display side of the display module; and at least one support assembly, disposed in the receiving chamber, wherein the support assembly at least includes a first retractable linkage and a first drive motor, a first end of the first retractable linkage is connected to the encapsulation housing, and a second end of the first retractable linkage is connected to the non-display side of the display module;

wherein the first drive motor is configured to drive the first retractable linkage to extend or retract, the first retractable linkage is extended to drive the bendable display region of the display module to bend, and the first retractable linkage is retracted to drive the bendable display region of the display module to flatten.

In some embodiments, the first retractable linkage includes a first moving portion and a second moving portion;

wherein the first drive motor is fixedly connected to the first moving portion, and the first drive motor is configured to drive the first moving portion and the second moving portion to move relative to each other.

In some embodiments, the first moving portion includes a rod structure having a first connection thread, and the second moving portion includes a tube structure having a strip connection groove, an extension direction of the connection groove is parallel to a length direction of the tube structure, and a second connection thread is disposed on a sidewall of the connection groove;

wherein the first drive motor is configured to adjust a screw length at which the first connection thread of the first moving portion is screwed with the second connection thread of the second moving portion.

In some embodiments, the support assembly further includes a second retractable linkage and a second drive motor; wherein a first end of the second retractable linkage is connected to the encapsulation housing, and a gap is defined between a second connection position of the second retractable linkage and the encapsulation housing, and a first connection position of the first retractable linkage and the encapsulation housing;

a second end of the second retractable linkage is connected to a target position of the first retractable linkage, the target position is between the first end and the second end of the first retractable linkage, and the target position is closer to the second end of the first retractable linkage with respect to the first end of the first retractable linkage; and the second drive motor is configured to drive the second retractable linkage to extend or retract, the second retractable linkage is extended to support the first retractable linkage, and the second retractable linkage is retracted to drive the bendable display region of the display module to flatten.

In some embodiments, the support assembly further includes a third retractable linkage, a third drive motor, a support linkage and a slideway;

a first end of the third retractable linkage is connected to the first end of the first retractable linkage;

the slideway is fixedly connected to the encapsulation housing, and an extension direction of the slideway is parallel to a plane where the planar display region of the display module is disposed, and a second end of the third retractable linkage is disposed in the slideway and is connected to a first end of the support linkage;

a second end of the support linkage is connected to a target position of the first retractable linkage, the target position is between the first end and the second end of the first retractable linkage, and the target position is closer to the second end of the first retractable linkage relative to the first end of the first retractable linkage; and the third drive motor is configured to drive the third retractable linkage to extend or retract within the slideway, wherein the third retractable linkage is extended to cause the support linkage support the first retractable linkage, and the third retractable linkage is retracted to drive the bendable display region of the display module to flatten.

In some embodiments, the support assembly further includes a first gear, a second gear and a fourth drive motor; wherein the first gear is connected to a first end of the encapsulation housing and the first retractable linkage, and relative positions of the first gear and the first retractable linkage are fixed;

the second gear is connected to the encapsulation housing, and the second gear and the first gear are engaged with each other; and the fourth drive motor is configured to drive the first gear to rotate by driving the second gear to rotate, such that an angle of rotation of the first retractable linkage connected to the first gear relative to a plane where the planar display region of the display module is disposed is adjusted.

In some embodiments, at least a first boundary extending along a first direction is disposed between the bendable display region and the planar display region of the display module, the at least one support assembly further includes two first support assemblies, and the display device further includes a first connection member;

wherein the first connection member extends along the first direction, the first connection member is connected to the non-display side of the display module, and a gap is defined between the two first support assemblies in the first direction, and the two first support assemblies are connected to the first connection member.

In some embodiments, at least a second boundary extending along a second direction is disposed between the bendable display region and the planar display region of the display module, the second direction is intersected with the first direction, the at least one support assembly further includes two second support assemblies, and the display device further includes a second connection member;

wherein the second connection member extends along the second direction, the second connection member is connected to the non-display side of the display module, and a gap is defined between the two second support assemblies in the second direction, and the two second support assemblies are connected to the second connection member.

In some embodiments, wherein the display module at least includes:

a display panel, having a display surface and a non-display surface;

a cover glass, disposed on the display surface of the display panel for protecting the display surface; and a module housing, having a first portion and a second portion, wherein the first portion is disposed on a side wall of the display panel and connected to the cover glass, and the second portion is disposed on a non-display surface of the display panel;

wherein the second end of the first retractable linkage is connected to the second portion of the module housing.

In some embodiments, the display module further includes a support plate; wherein the support plate at least has a first support region and a second support region, the first support region is within the planar display region, and the second support region is within the bendable display region; and a portion of the support plate disposed in the first support region is a solid structure, and a portion of the support plate disposed in the second support region has a target structure, and a thickness of the target structure being less than a thickness of the support plate.

In some embodiments, the bendable display region of the display module includes a first unidirectional bendable display region, a second unidirectional bendable display region, and a bidirectional bendable display region; wherein the first unidirectional bendable display region is a strip region extending along a first direction, the second unidirectional bendable display region is a strip region extending along a second direction, the second direction is intersected with the first direction, the bidirectional bendable display region and the first unidirectional bendable display region are arranged along the first direction, and the bidirectional bendable display region and the second unidirectional bendable display region are arranged along the second direction; and the second support region of the support plate includes a first unidirectional support region, a second unidirectional support region, and a bidirectional support region, the first unidirectional support region is within the first unidirectional bendable display region, the second unidirectional support region is within the second unidirectional bendable display region, and the bidirectional support region is within the bidirectional bendable display region;

wherein through-holes in the first unidirectional support region include a plurality of first strip through-holes extending along the first direction, the plurality of first strip through-holes constitute a plurality of first through-hole groups arranged in a second direction, each of the first through-hole groups includes a plurality of first strip through-holes, and the first strip through-holes of two adjacent first through-hole groups are interleaved;

through-holes in the second unidirectional support region includes a plurality of second strip through-holes extending along the second direction, the plurality of second strip through-holes constitute a plurality of second through-hole groups arranged in a first direction, each of the second through-hole groups includes a plurality of second strip through-holes, the second strip through-holes of two adjacent second through-hole groups are interleaved; and through-holes of the bidirectional support region at least includes a plurality of circular holes, the circular hole and at least one first through-hole group are arranged along the first direction, and the circular hole and at least one second through-hole group are arranged along the second direction.

In some embodiments, the through-holes of the bidirectional support region further include a plurality of third through-hole groups and a plurality of fourth through-hole groups, the plurality of third through-hole groups and the plurality of fourth through-hole groups are interleaved along the second direction; wherein the third through-hole group includes a plurality of third strip through-holes arranged in the second direction and extending in the first direction, a length of the third strip through-hole in the first direction is equal to a sum of widths of m second strip through-holes and gap widths between m−1 adjacent second through-hole groups, m is a positive integer greater than or equal to 2, and the third through-hole groups are arranged along the second direction with the first through-hole groups; and the fourth through-hole group includes a plurality of fourth strip through-holes arranged in the second direction and extending in the second direction, a length of the fourth strip through-hole in the second direction is equal to a sum of the widths of n first strip through-holes and gap widths between n−1 adjacent first through-hole groups, n is a positive integer greater than or equal to 2, and the fourth through-hole groups are arranged along the second direction with the second through-hole groups.

In some embodiments, the first unidirectional bendable display region includes a first unidirectional sub-display region and a second unidirectional sub-display region, and the second unidirectional bendable display region includes a third unidirectional sub-display region and a fourth unidirectional sub-display region;

wherein the first unidirectional sub-display region and the second unidirectional sub-display region are respectively disposed on both sides of the bidirectional bendable display region in the first direction, and the third unidirectional sub-display region and the fourth unidirectional sub-display region are respectively disposed on both sides of the bidirectional bendable display region in the second direction;

the first unidirectional support region includes a first unidirectional sub-support region and a second unidirectional sub-support region, and the second unidirectional support region includes a third unidirectional sub-support region and a fourth unidirectional sub-support region; and the first unidirectional sub-support region and the second unidirectional sub-support region are respectively disposed on both sides of the bidirectional support region in the first direction, and the third unidirectional sub-support region and the fourth unidirectional sub-support region are respectively disposed on both sides of the bidirectional support region in the second direction.

In some embodiments, the planar display region includes a first sub-planar display region, a second sub-planar display region, a third sub-planar display region, and a fourth sub-planar display region; wherein the first sub-planar display region and the second sub-planar display region are respectively disposed on both sides of the third unidirectional sub-planar display region, the third sub-planar display region and the fourth sub-planar display region are respectively disposed on both sides of the fourth unidirectional sub-planar display region, and the first sub-planar display region and the third sub-planar display region are respectively disposed on both sides of the first unidirectional sub-planar display region, the second sub-planar display region and the fourth sub-planar display region are respectively disposed on both sides of the second unidirectional sub-display region;

the first support region including a first sub-support region, a second sub-support region, a third sub-support region, and a fourth sub-support region; and the first sub-support region and the second sub-support region are respectively disposed on both sides of the third unidirectional sub-support region, the third sub-support region and the fourth sub-support region are respectively disposed on both sides of the fourth unidirectional sub-support region, the first sub-support region and the third sub-support region are respectively disposed on both sides of the first unidirectional sub-support region, and the second sub-support region and the fourth sub-support region are respectively disposed on both sides of the second unidirectional sub-support region.

According to some embodiments of the present disclosure, a vehicle is provided, including a body, and a display device as described above aspect disposed within the body.

BRIEF DESCRIPTION OF DRAWINGS

In order to describe the technical solutions in the embodiments of the present disclosure more clearly, the following briefly describes the accompanying drawings required for describing the embodiments. Apparently, the accompanying drawings in the following description show merely some embodiments of the present disclosure, and those of ordinary skill in the art can still derive other drawings from these accompanying drawings without creative efforts.

DETAILED DESCRIPTION

In order to make the objects, technical solutions and advantages of the present disclosure clearer, embodiments of the present disclosure are described in further detail below in conjunction with the accompanying drawings.

In the related art, a folded display module typically includes a folded display panel and a support assembly disposed on a back side of the display panel. The support assembly is configured to support the display panel.

However, the folded display module in the related art needs to be folded or flattened manually and has a bad flexibility.

Figure 1:
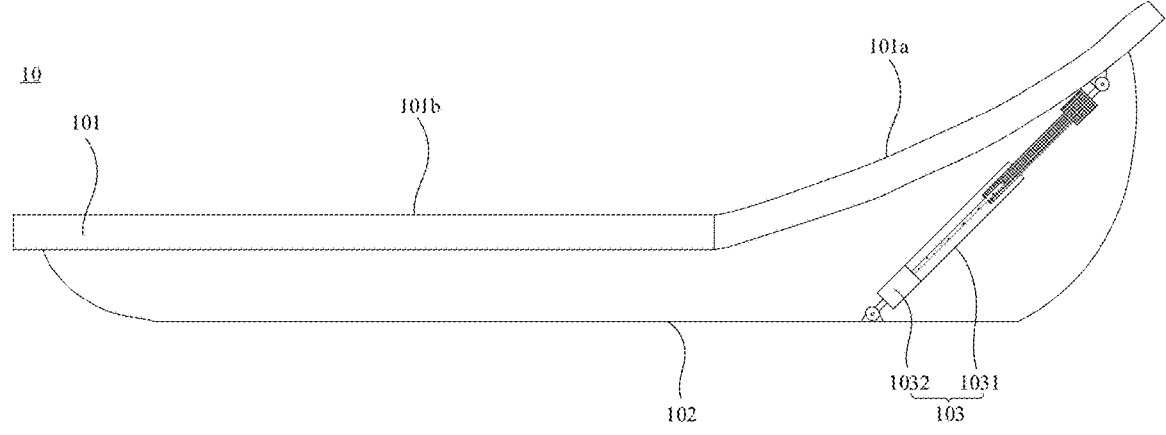
FIG. 1 is a schematic diagram of a structure of a display device according to some embodiments of the present disclosure.

FIG. 1 is a schematic diagram of a structure of a display device according to some embodiments of the present disclosure. As can be seen with reference to FIG. 1, the display device 10 includes a display module 101, an encapsulation housing 102, and at least one support assembly 103.

The display module 101 has a bendable display region 101*a* and a planar display region 101*b* (the planar display region 101*b* is also referred to as a permanently unbendable display region). The encapsulation housing 102 is disposed on a non-display side of the display module 101, and a receiving chamber is formed between the encapsulation housing 102 and the non-display side of the display module 101. The display device includes at least one support assembly 103 disposed within the receiving chamber.

The support assembly 103 at least includes a first retractable linkage 1031 and a first drive motor 1032. A first end of the first retractable linkage 1031 is connected to the encapsulation housing 102, and a second end of the first retractable linkage 1031 is connected to the non-display side of the display module 101. The first drive motor 1032 is disposed at the first end of the first retractable linkage 1031, the first drive motor 1032 is configured to drive the first retractable linkage 1031 to extend or retract. The first retractable linkage 1031 is extended to drive the bendable display region 101*a* of the display module 101 to bend, and the first retractable linkage 1031 is retracted to drive the bendable display region 101*a* of the display module 101 to flatten.

In the embodiments of the present disclosure, the extending and retracting of the first retractable linkage 1031 is realized by controlling the forward and reverse rotation of the first drive motor 1032. In some embodiments, the first retractable linkage 1031 is extended in the case that the first drive motor 1032 is rotating positively. The second end of the extended first retractable linkage 1031 pushes the bendable display region 101*a* of the display module 101 to move in a direction distal from the encapsulation housing 102, thereby causing the bendable display region 101*a* of the display module 101 to bend. In the case that the first drive motor 1032 is reversed, the first retractable linkage 1031 is retracted. The second end of the retracted first retractable linkage 1031 pulls the bendable display region 101*a* of the display module 101 to move in a direction close to the encapsulation housing 102, thereby causing the bendable display region 101*a* of the display module 101 to flatten.

In summary, embodiments of the present disclosure provide a display device including the display module, the encapsulation housing, and at least one support assembly. The support assembly includes the first retractable linkage and the first drive motor. The first end and the second end of the first retractable linkage are connected to the encapsulation housing and a non-display side of the display module respectively. The first drive motor is capable of automatically driving the first retractable linkage to extend or retract, thereby realizing automatic bending or flattening of the bendable display region of the display module, and the display device has high flexibility in use.

It should be noted that the retractable amount of the first retractable linkage 1031 in the support assembly 103 is adjustable and can be maintained at any distance, such that the curvature of the bendable region 101*a* of the display module 101 is dynamically adjustable, truly realizing arbitrary curvature and changing shapes, and the display device presents more display states and realizes "customization" of shapes.

Figure 2:
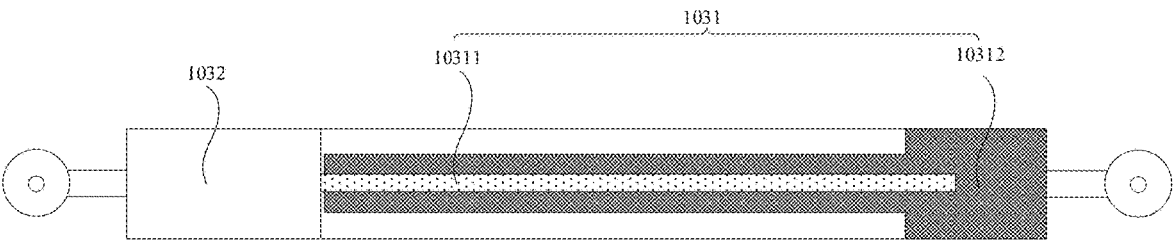
FIG. 2 is a schematic diagram of a structure of a support assembly according to some embodiments of the present disclosure.

FIG. 2 is a schematic diagram of the first retractable linkage and the first drive motor according to some embodiments of the present disclosure. Referring to FIG. 2, it can be seen that the first retractable linkage 1031 includes a first moving portion 10311 and a second moving portion 10312. The first drive motor 1032 is fixedly connected to an end of the first moving portion 10311 distal from the second moving portion 10312, and the first drive motor 1032 is configured to drive the first moving portion 10311 and the second moving portion 10312 to move relative to each other.

Figure 3:
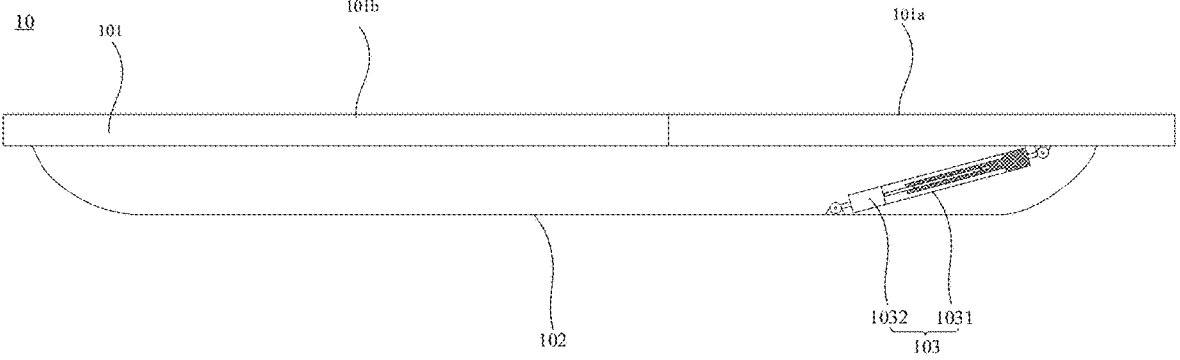
FIG. 3 is a schematic diagram of the structure of another display device according to some embodiments of the present disclosure.

Referring to FIG. 1, in the case that the first drive motor 1032 drives to make the moving distance between the first moving portion 10311 and the second moving portion 10312 larger, the first retractable linkage 1031 can be made to extend, and the bendable display region 101*a* of the display module 101 is bent. Referring to FIG. 3, in the case that the first drive motor 1032 drives the distance between the first moving portion 10311 and the second moving portion 10312 to be smaller, the first retractable linkage 1031 is retracted, and the bendable display region 101*a* of the display module 101 is flattened.

In some embodiments, the first moving portion 10311 include a rod structure having a first connection thread. The second moving portion 10312 include a tube structure having a strip connection groove. The extension direction of the connection groove is parallel to a length direction of the tube structure, and a second connection thread is disposed on a sidewall of the connection groove. The first connection thread and the second connection thread are screwed to each other. The first drive motor 1032 is configured to adjust a screw length of the first connection thread of the first moving portion 10311 with the second connection thread of the second moving portion 10312.

Exemplarily, the length of the first retractable linkage 1031 is negatively correlated with the screw length of the first connection thread with the second connection thread. That is, the longer the screw length of the first connection thread with the second connection thread is, the more the first moving portion 10311 is disposed in the connection groove of the second moving portion 10312, and the shorter the length of the first retractable linkage 1031 is. The shorter the screw length of the first connection thread with the second connection thread is, the less the portion of the first moving portion 10311 is disposed in the connection groove of the second moving portion 10312, and the longer the length of the first retractable linkage 1031 is.

Figure 4:
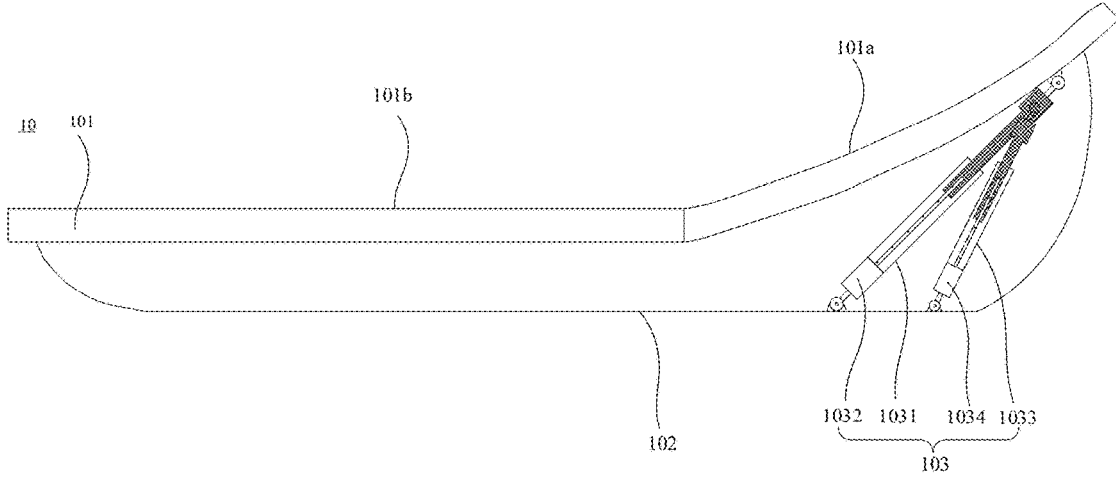
FIG. 4 is a schematic diagram of the structure of still another display device according to some embodiments of the present disclosure.

FIG. 4 is a schematic diagram of another display device according to some embodiments of the present disclosure. As can be seen with reference to FIG. 4, the support assembly 103 further includes a second retractable linkage 1033 and a second drive motor 1034.

A first end of the second retractable linkage 1033 is connected to the encapsulation housing 102, and a gap is defined between a second connection position of the second retractable linkage 1033 and the encapsulation housing 102, and the first connection position of the first retractable linkage 1031 and the encapsulation housing 102. For example, the second connection position is further distal from the planar display region 101*b* of the display module 101 relative to the first connection position.

The second end of the second retractable linkage 1033 is connected to a target position of the first retractable linkage 1031. The target position is between the first end and the second end of the first retractable linkage 1031, and the target position is closer to the second end of the first retractable linkage 1031 relative to the first end of the first retractable linkage 1031. That is, the second end of the second retractable linkage 1033 is not connected to the non-display side of the display module 101, but is directly connected to the first retractable linkage 1031.

The second drive motor 1034 is connected to the first end of the second retractable linkage 1033, and the second drive motor 1034 is configured to drive the second retractable linkage 1033 to extend or retract. The second retractable linkage 1033 is extended to support the first retractable linkage 1031, and the second retractable linkage 1033 is retracted to drive the bendable display region 101*a* of the display module 101 to flatten.

In the embodiments of the present disclosure, the extending and retracting of the second retractable linkage 1033 is realized by controlling the forward and reverse rotation of the second drive motor 1034. The operating state of the second drive motor 1034 is the same as the operating state of the first drive motor 1032. The operating state of the drive motor includes forward rotation, reverse rotation, and stationary. In the case that the operating state of the first drive motor 1032 is forward rotation, the operating state of the second drive motor 1034 is also forward rotation. In the case that the operating state of the first drive motor 1032 is reversed rotation, the operating state of the second drive motor 1034 is also reversed rotation. In the case that operating state of the first drive motor 1032 is stationary, the operating state of the second drive motor 1034 is also stationary.

Figure 5:
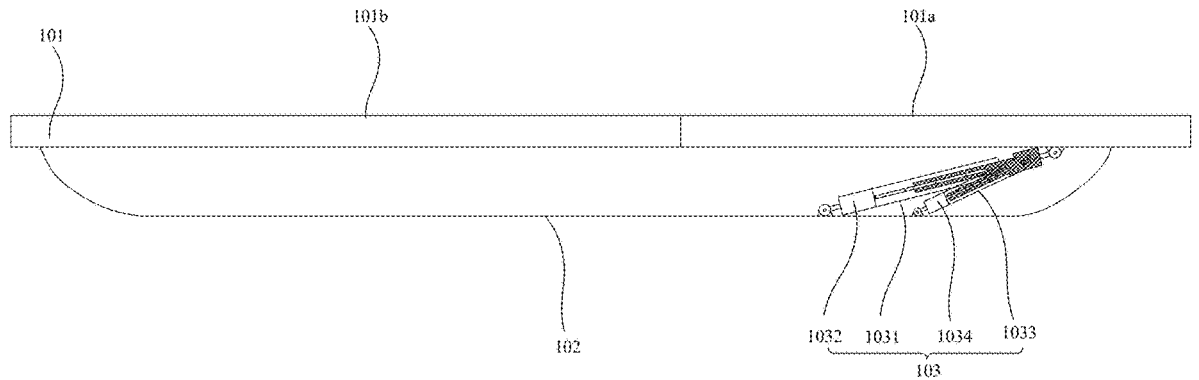
FIG. 5 is a schematic diagram of the structure of still another display device according to some embodiments of the present disclosure.

In some embodiments, referring to FIG. 4, in the case that the second drive motor 1034 is rotating positively, the second retractable linkage 1033 is extended. The extended second end of the second retractable linkage 1033 pushes the second end of the first retractable linkage 1031, which makes it easier for the second end of the first retractable linkage 1031 to push the bendable display region 101*a* of the display module 101 to move in a direction distal from the encapsulation housing 102, such that the bendable display region 101*a* of the display module 101 is bent. Referring to FIG. 5, the second retractable linkage 1033 is retracted in the case that the first drive motor 1032 is reversed. The retracted second end of the second retractable linkage 1033 pulls the second end of the first retractable linkage 1031. The bendable display region 101*a* of the display module 101 is pulled in the direction close to the encapsulation housing 102, such that the bendable display region 101*a* of the display module 101 is flattened.

In some embodiments of the present disclosure, the structure of the second retractable linkage 1033 is the same as the structure of the first retractable linkage 1031. The second retractable linkage 1033 and the second drive motor 1034 are connected in the same manner as the first retractable linkage 1031 and the first drive motor 1032.

Exemplarily, the second retractable linkage 1033 includes a third moving portion and a fourth moving portion. The second drive motor 1034 is fixedly connected to an end of the third moving portion distal from the fourth moving portion, and the second drive motor 1034 is configured to drive the third moving portion and the fourth moving portion to move relative to each other. The structure of the third moving portion is equivalent to the structure of the first moving portion 10311, and the structure of the fourth moving portion is equivalent to the structure of the second moving portion 10312. Embodiments of the present disclosure is not described in detail herein.

Figure 6:
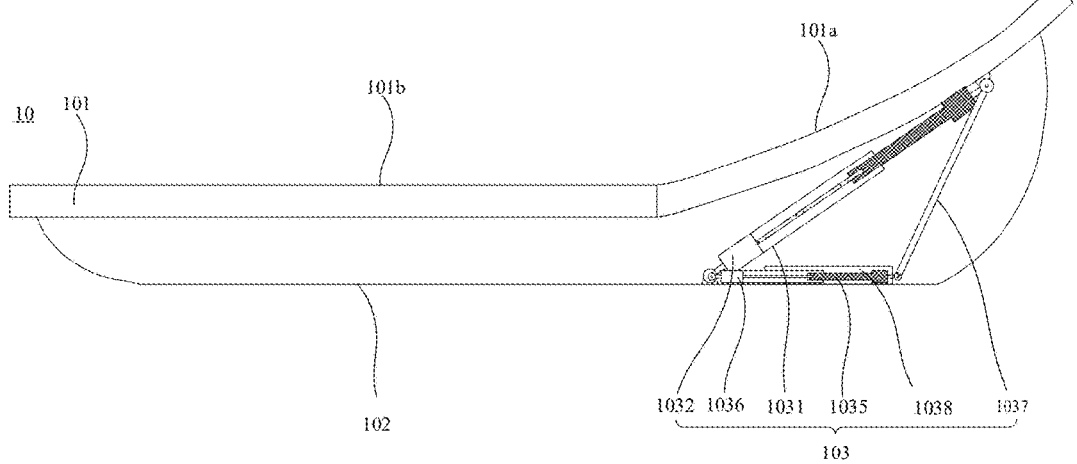
FIG. 6 is a schematic diagram of the structure of still another display device according to some embodiments of the present disclosure.

FIG. 6 is a schematic diagram of another display device according to some embodiments of the present disclosure. As can be seen with reference to FIG. 6, the support assembly 103 further includes a third retractable linkage 1035, a third drive motor 1036, a support linkage 1037, and a slideway 1038.

A first end of the third retractable linkage 1035 is connected to a first end of the first retractable linkage 1031. Alternatively, a first end of the third retractable linkage 1035 is directly connected to the encapsulation housing 102.

The slideway 1038 is fixedly connected to the encapsulation housing 102, and the extension direction of the slideway 1038 is parallel to the plane where the planar display region 101*b* of the display module 101 is disposed. A second end of the third retractable linkage 1035 is disposed within the slideway 1038 and is connected to a first end of the support linkage 1037. The third retractable linkage 1035 is capable of sliding within the slideway 1038.

The length of the support linkage 1037 is a fixed length. The second end of the support linkage 1037 is connected to a target position of the first retractable linkage 1031, the target position is between the first end and the second end of the first retractable linkage 1031, and the target position is closer to the second end of the first retractable linkage 1031 relative to the first end of the first retractable linkage 1031.

Figure 7:
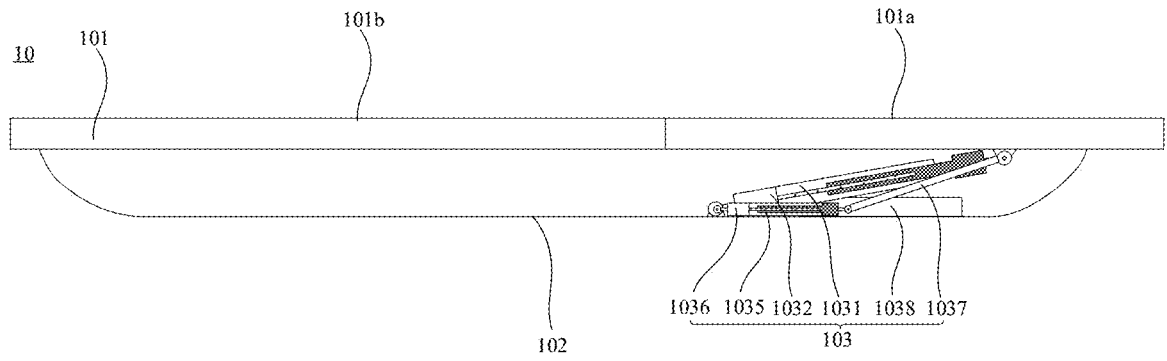
FIG. 7 is a schematic diagram of the structure of still another display device according to some embodiments of the present disclosure.

The third drive motor 1036 is configured to drive the third retractable linkage 1035 to extend or retract within the slideway 1038. Referring to FIG. 6, the third retractable linkage 1035 is extended to support linkage 1037 to cause the support linkage 1037 to provide a supporting force for the first retractable linkage 1031, such that the bendable display region 101*a* of the display module 101 is bent. Referring to FIG. 7, the third expandable linkage 1035 is retracted to drive the bendable display region 101*a* of the display module 101 to flatten.

In the embodiment, the first retractable linkage 1031, the third retractable linkage 1035, and the support linkage 1037 are presented as a triangular structure, which improves the structural stability, allows the display module 101 to maintain a fixed curvature for a long time, and realizes the local curved surface display of the display module 101.

Figure 8:
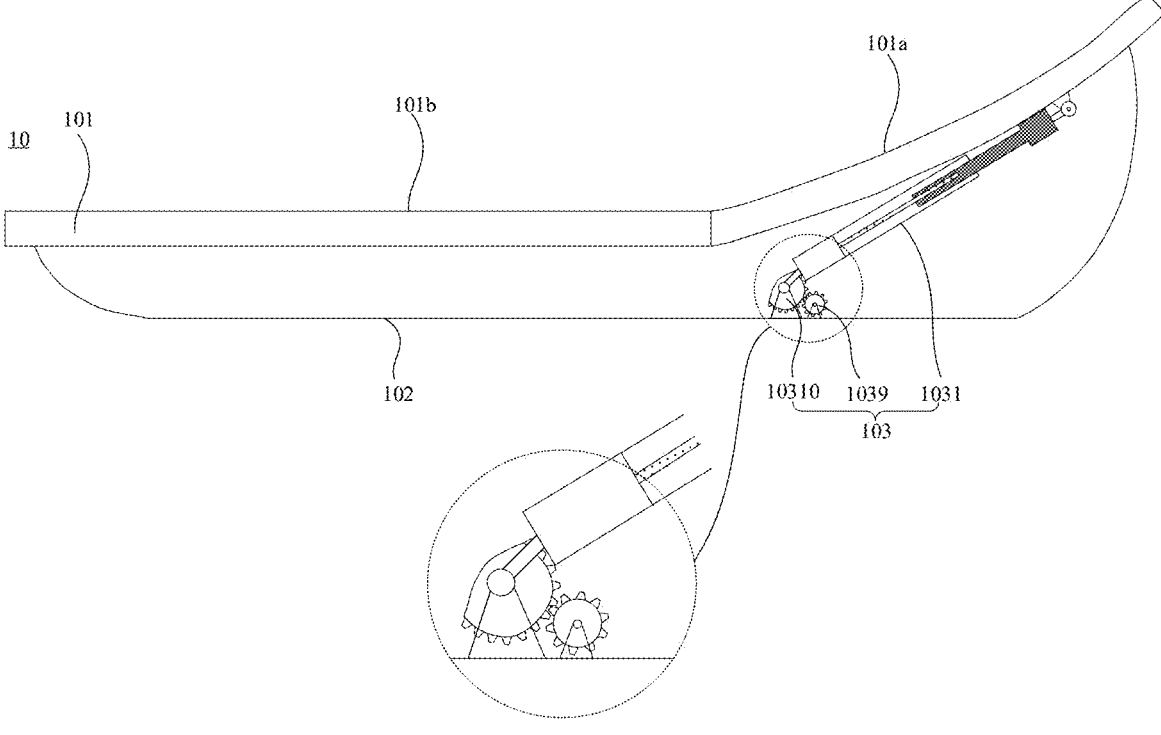
FIG. 8 is a schematic diagram of the structure of still another display device according to some embodiments of the present disclosure.

FIG. 8 is a schematic diagram of the structure of still another display device according to some embodiments of the present disclosure. Referring to FIG. 8, the support assembly 103 further includes a first gear 1039, a second gear 10310, and a fourth drive motor (not shown in the figure).

The first gear 1039 is connected to a first end of the encapsulation housing 102 and the first retractable linkage 1031, and the relative positions of the first gear 1039 and the first retractable linkage 1031 are fixed.

The second gear 10310 is connected to the encapsulation housing 102, and the second gear 10310 and the first gear 1039 are engaged with each other.

The fourth drive motor is configured to drive the first gear 1039 to rotate by driving the second gear 10310, thereby adjusting the angle of rotation of the first retractable linkage 1031 connected to the first gear 1039 with respect to the plane where the planar display region 101*b* of the display module 101 is disposed.

Figure 9:
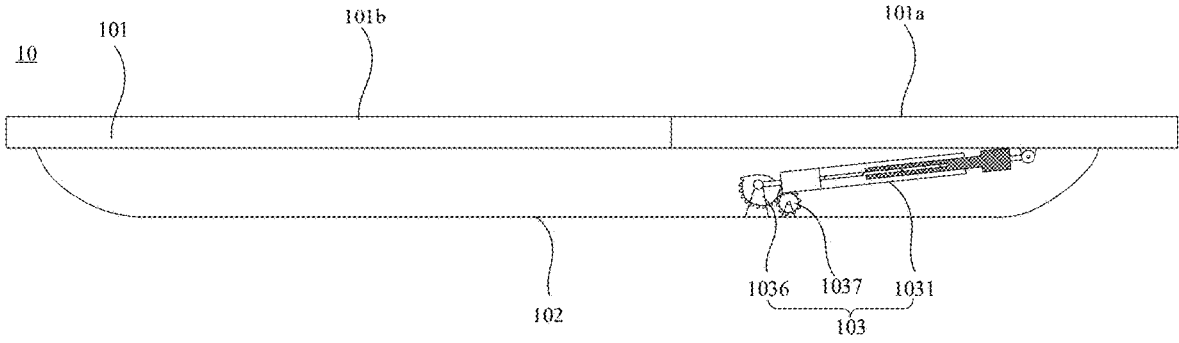
FIG. 9 is a schematic diagram of the structure of still another display device according to some embodiments of the present disclosure.

With reference to FIG. 8, in the case that the angle of rotation of the first retractable linkage 1031 with respect to the plane where the planar display region 101*b* of the display module 101 is disposed is larger, a length of the first retractable linkage 1031 is enlarged in order to realize bending of the bendable display region 101*a* of the display module 101. Referring to FIG. 9, in the case that the angle of rotation of the first retractable linkage 1031 with respect to the plane where the planar display region 101*b* of the display module 101 is disposed is smaller, the length of the first retractable linkage 1031 is reduced to realize the flattening of the bendable display region 101*a* of the display module 101.

In some embodiments of the present disclosure, the display module 101 is a unidirectional bendable display module or a bidirectional bendable display module. For example, the display module 101 is a unidirectional bendable display module with the first direction as an axis, or a unidirectional bendable display module with the second direction as an axis, or a bidirectional bendable display module with the first direction and the second direction as axes. The first direction is intersected with the second direction, for example, the first direction and the second direction are perpendicular to each other.

In some embodiments, the first direction is a pixel column direction X, and the second direction is a pixel row direction Y. Alternatively, the first direction is a pixel row direction Y, and the second direction is a pixel column direction X. Alternatively, the first direction and the second direction are any two directions that intersect with each other, and the embodiments of the present disclosure do not make any specific limitations on the first direction and the second direction.

The embodiment of the present disclosure is briefly illustrated by taking the first direction as the pixel column direction X and the second direction as the pixel row direction Y as an example.

Figure 10:
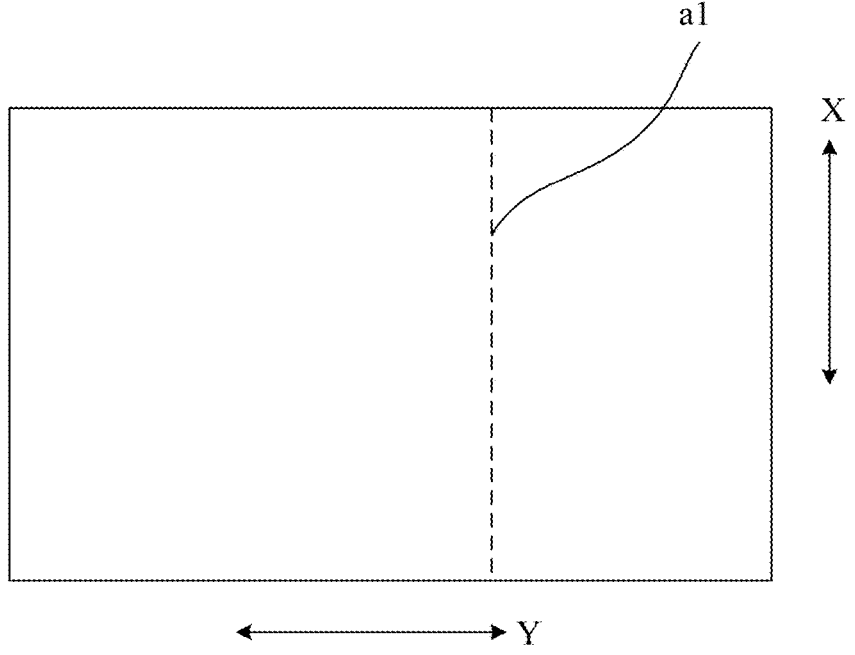
FIG. 10 is a top view of a display module according to some embodiments of the present disclosure.
Figure 11:
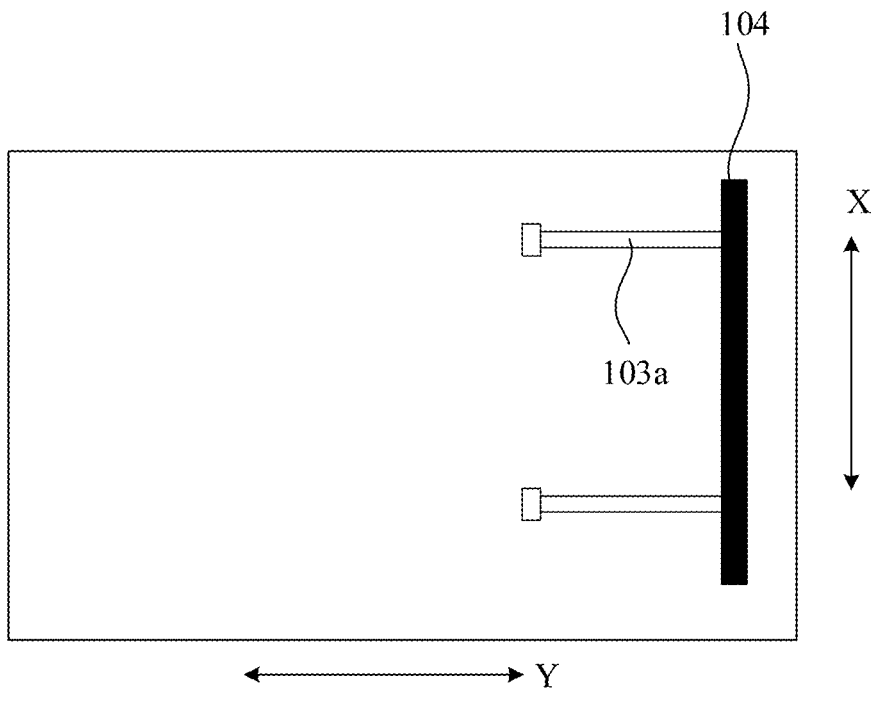
FIG. 11 is a top view of a support assembly according to some embodiments of the present disclosure.

As an optional implementation, FIG. 10 is a top view of a display module according to some embodiments of the present disclosure. Referring to FIG. 10, a first boundary a1 extending along the first direction X is disposed between the bendable display region 101*a* and the planar display region 101*b* of the display module 101. FIG. 11 is a top view of a support assembly according to some embodiments of the present disclosure. Referring to FIG. 11, the at least one support assembly 103 includes two first support assemblies 103*a*. The display device 10 further includes a first connection member 104.

The first connection member 104 extends along a first direction X, the first connection member 104 is connected to the non-display side of the display module 101, and a gap is defined between the two first support assemblies 103*a* in the first direction X, and the two first support assemblies 103*a* are connected to the first connection member 104. Because the first connection member 104 is extending along the first direction X, the first connection member 104 has a strip structure or a hinge structure. By designing the first connection member 104 and the two first support assemblies 103*a* connected to the first connection member 104, the uniformity of the force from the two first support assemblies 103*a* can be improved when pushing the bendable display region 101*a* of the display module 101 to bend, and the bending effect can be improved.

It should be noted that the display module 101 shown in FIG. 10 is a unidirectional bendable display module with the first direction X as an axis. Accordingly, the support assembly 103 and the first connection member 104 shown in FIG. 11 are configured to support the right portion (the bendable display region 101*a*) of the display module 101 to make the right portion of the display module 101 bendable.

Figure 12:
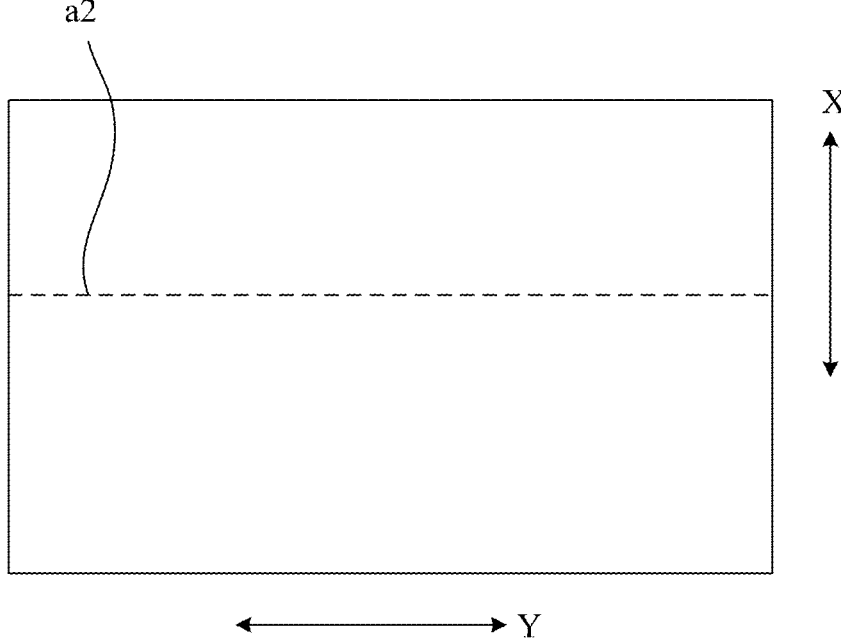
FIG. 12 is a top view of another display module according to some embodiments of the present disclosure.
Figure 13:
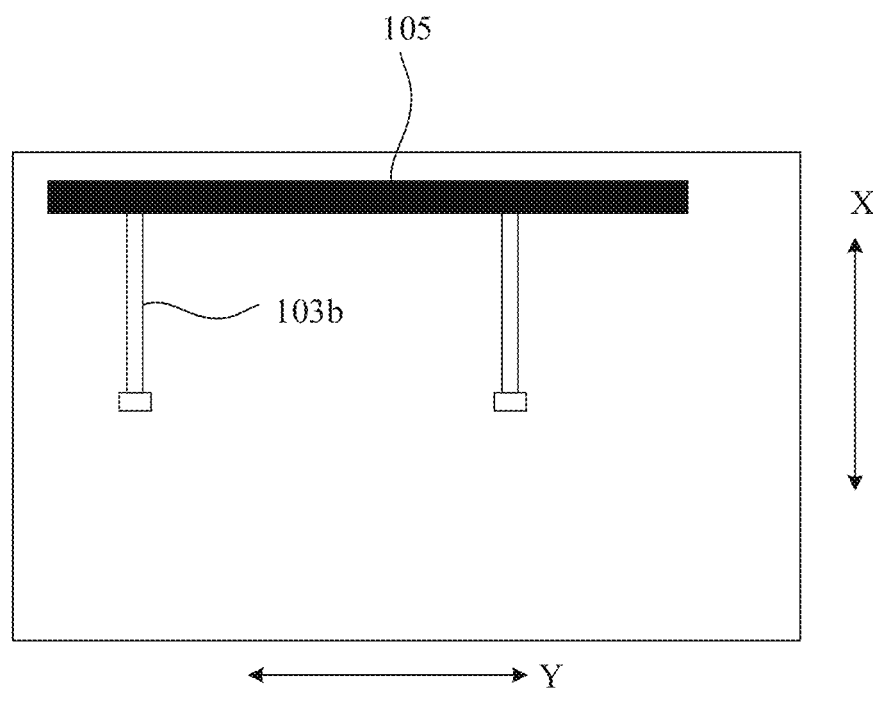
FIG. 13 is a top view of another support assembly according to some embodiments of the present disclosure.

As another optional implementation, referring to FIG. 12, a second boundary a2 extending along a second direction Y is disposed between the bendable display region 101*a* and the planar display region 101*b* of the display module 101. Referring to FIG. 13, the at least one support assembly 103 includes two second support assemblies 103*b*. The display device 10 further includes a second connection member 105.

The second connection member 105 extends along the second direction Y, the second connection member 105 is connected to the non-display side of the display module 101, and a gap is defined between the two second support assemblies 103*b* in the second direction Y, and the two second support assemblies 103*b* are connected to the second connection member 105. Because the second connection member 105 is extending along the second direction Y, the second connection member 105 has a strip structure or of a hinge-like structure. By designing the second connection member 105 and the two second support assemblies 103*b* to be connected to the second connection member 105, the uniformity of the force of the two second support assemblies 103*b* can be improved when pushing the bendable display region 101*a* of the display module 101 to bend, and the bending effect can be improved.

It should be noted that the display module 101 shown in FIG. 12 is a unidirectional bendable display module with the second direction Y as an axis. Accordingly, the support assembly 103 and the second connection member 105 shown in FIG. 13 is configured to support the upper portion (the bendable display region 101*a*) of the display module 101 to make the upper portion of the display module 101 bendable.

Figure 14:
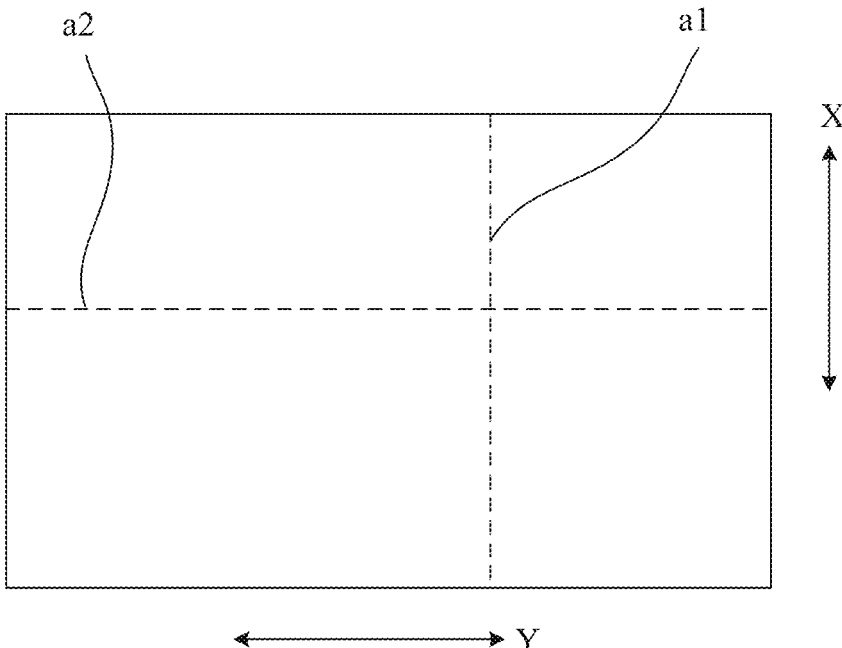
FIG. 14 is a top view of still another display module according to some embodiments of the present disclosure.
Figure 15:
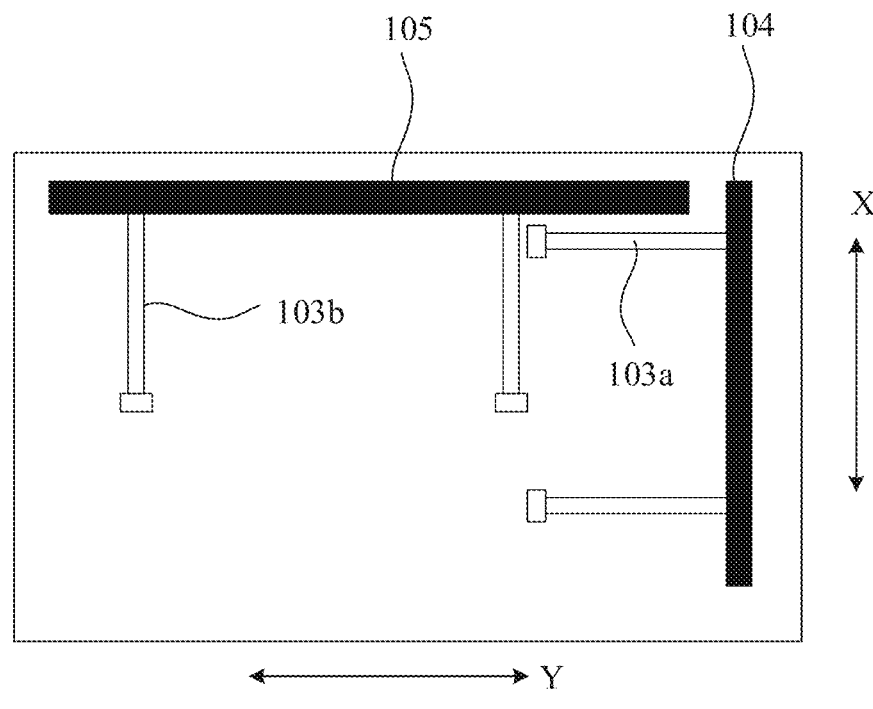
FIG. 15 is a top view of still another display module according to some embodiments of the present disclosure.

As still another optional implementation, referring to FIG. 14, a first boundary a1 extending along a first direction X and a second boundary a2 extending along a second direction Y are disposed between the bendable display region 101*a* and the planar display region 101*b* of the display module 101. Referring to FIG. 15, the at least one support assembly 103 includes two first support assemblies 103*a* and two second support assemblies 103*b*. The display device 10 includes a first connection member 104 and a second connection member 105.

The first connection member 104 extends along a first direction X, the first connection member 104 is connected to the non-display side of the display module 101, and a gap is defined between the two first support assemblies 103*a* in the first direction X, and the two first support assemblies 103*a* are connected to the first connection member 104. The second connection member 105 extends along the second direction Y, the second connection member 105 is connected to the non-display side of the display module 101, and a gap is defined between the two second support assemblies 103*b* in the second direction Y, and the two second support assemblies 103*b* are connected to the second connection member 105.

Because the first connection member 104 extends along the first direction X and the second connection member 105 extends along the second direction Y, the first connection member 104 and the second connection member 105 have a strip structure or a hinge structure. By designing the first connection member 104 and the second connection member 105, the two first support assemblies 103*a* are connected to the first connection member 104, and the two second support assemblies 103*b* are connected to the second connection member 105. In this way, in the case that the display module 101 is bent along the first boundary a1 in the first direction X, the first support assemblies 103a can be made to push the bendable display region 101a of the display module 101 to bend in a uniform manner, such that the effect of left-right bending is improved. In addition, In the case that the display module 101 is bent along the second demarcation a2 in the second direction Y, the second support assembly 103b pushes the bendable display region 101a of the display module 101 to bend with a uniform force, and the up-and-down bending effect improved.

It should be noted that a boundary is disposed between the bendable display region 101a and the flat display region 101b of the display module 101 in the first direction and the second direction, indicating that the display module 101 is a bidirectionally bendable display module 101. For example, the right portion of the display module 101 is bendable with the axis of the first direction X, and the upper portion of the display module 101 is bendable with the axis of the second direction Y. The second support assembly 103b is bendable in the first direction Y, and is bendable in the upper direction Y.

Figure 16:
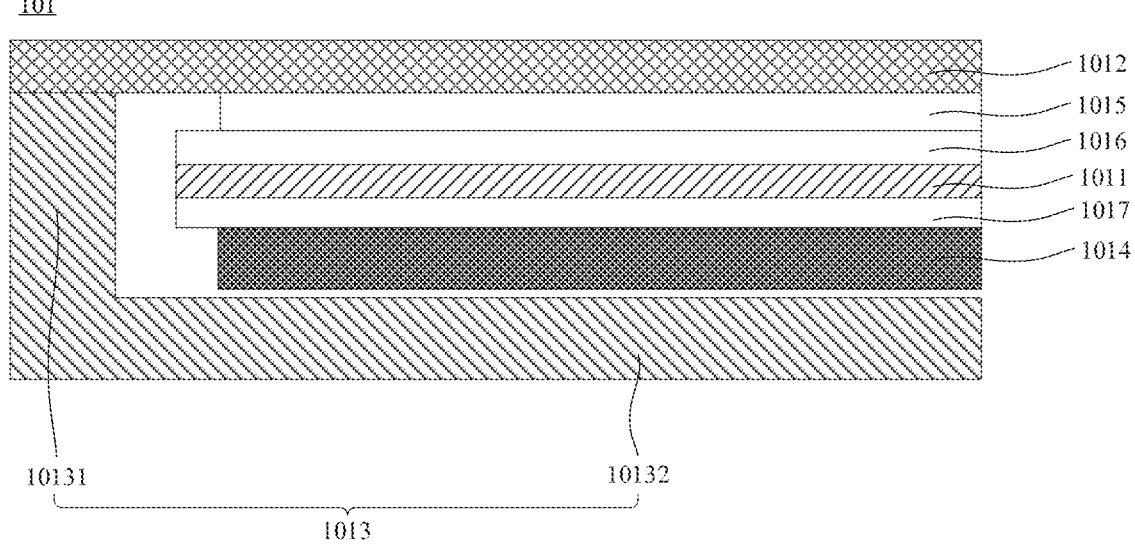
FIG. 16 is a cross-sectional view of a display module according to some embodiments of the present disclosure.

FIG. 16 is a schematic diagram of a structure of a display module according to some embodiments of the present disclosure. Referring to FIG. 16, the display module 101 at least includes a display panel 1011, a cover glass (CG) 1012, and a module housing 1013. The display panel 1011 has a display surface and a non-display surface. The cover glass 1012 is disposed on the display surface of the display panel 1011 for protecting the display surface. The module housing 1013 has a first portion 10131 and a second portion 10132, wherein the first portion 10131 is disposed on a sidewall of the display panel 1011 and is connected to the cover glass 1012, and the second portion 10132 is disposed on the non-display surface of the display panel 1011. The second end of the first retractable linkage 1031 is connected to the second portion 10132 of the module housing 1013.

Because the second end of the first retractable linkage 1031 is connected to the second portion 10132 of the module housing 1013, and the module housing 1013 plays a protective role for the display panel 1011, in the case that the first retractable linkage 1031 extends and bends the display module 101, the display panel 1011 is not caused to be damaged, ensuring the display effect of the display module 101.

In some embodiments, in order to facilitate the bending and waterproofing of the display module 101, the display module 101 containing the graphically processed support plate 1014 is first assembled with the module housing 1013. The module housing 1013 is made of a bendable material such as thin aluminum sheet or stainless steel (SUS).

Figure 17:
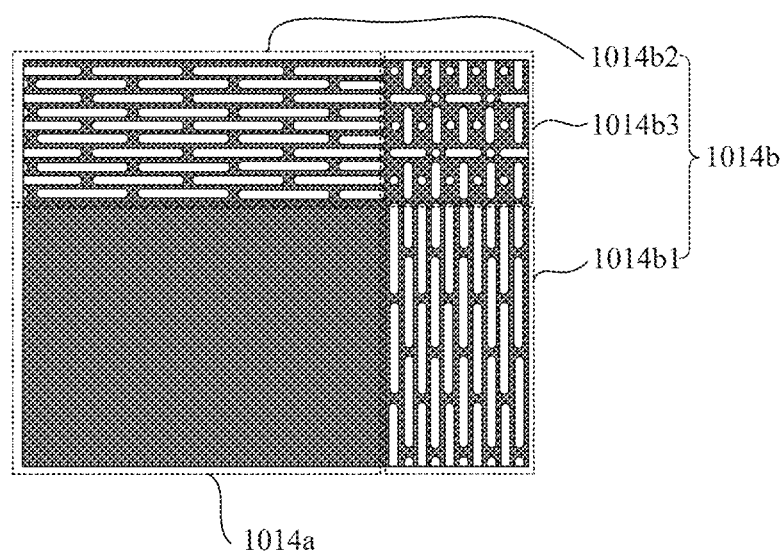
FIG. 17 is a top view of a support plate according to some embodiments of the present disclosure.

In some embodiments, referring to FIG. 16, the display module 101 further includes a support plate 1014. Referring to FIG. 17, the support plate 1014 at least has a first support region 1014a and a second support region 1014b. The first support region 1014a is within the planar display region 101b, and the second support region 1014b is within the bendable display region 101a. The portion of the support plate 1014 disposed in the first support region 1014a has a solid structure, and the portion disposed in the second support region 1014b has a target structure. A thickness of the target structure is less than a thickness of the support plate 1014. The solid structure refers to a structure that is solid internally, such as a solid structure without through-holes or openings. The portion disposed in the second support region 1014b having the target structure indicates that the second support region 1014b needs to be performed an etching treatment on top of the solid structure. The etching treatment is a full etching or a half etching. The full etching indicates that the target structure is a through-hole, and the half etching indicates that the target structure is a notch.

Because the planar display region 101b of the display module 101 is not needed to be bent, the first support region 1014a of the support plate 1014 for supporting the planar display region 101b is designed as a solid structure, such that on the one hand, the rigidity of the support plate 1014 is improved and the support effect can be improved, and on the other hand, the bending of the display module 101 is not affected. In addition, because the bendable display region 101a of the display module 101 needs to be bent, designing the second support region 1014b of the support plate 1014 for supporting the bendable display region 101a with through-holes can reduce the bendable stress when the second support region 1014b of the support plate 1014 is bent, and avoid defects such as cracking of the film layer of the bendable display region 101a of the display module 101 and failure of the device.

Figure 18:
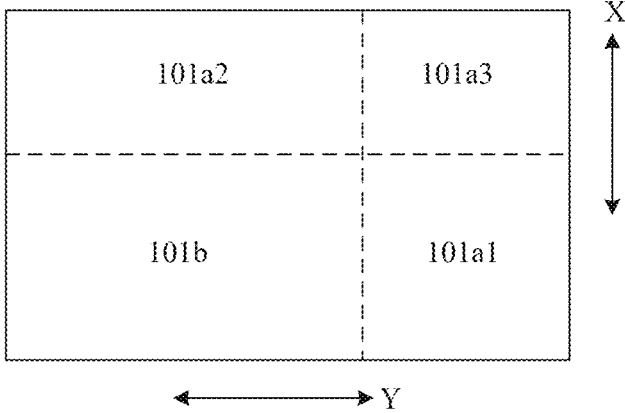
FIG. 18 is a top view of another display module according to some embodiments of the present disclosure.

Referring to FIG. 18, the bendable display region 101a of the display module 101 includes a first unidirectional bendable display region 101a1, a second unidirectional bendable display region 101a2, and a bidirectional bendable display region 101a3. The first unidirectional bendable display region 101a1 is a strip region extending along a first direction X, and the second unidirectional bendable display region 101a2 is a strip region extending along a second direction Y. The second direction Y is intersected with the first direction X. The bidirectional bendable display region 101a3 and the first unidirectional bendable display region 101a1 are arranged along the first direction X, and the bidirectional bendable display region 101a3 and the second unidirectional bendable display region 101a2 are arranged along the second direction Y.

Accordingly, referring to FIG. 17, the second support region 1014b of the support plate 1014 includes a first unidirectional support region 1014b1, a second unidirectional support region 1014b2, and a bidirectional support region 1014b3. The first unidirectional support region 1014b1 is with the first unidirectional bendable display region 101a1, and the second unidirectional support region 1014b2 is within the second unidirectional bendable display region 101a2. The bidirectional support region 1014b3 is within the bidirectional bendable display region 101a3.

The through-holes in the first unidirectional support region 1014b1 include a plurality of first strip through-holes b1 extending along the first direction X. The plurality of first strip through-holes b1 constitute a plurality of first through-hole groups b arranged in the second direction Y. Each of the first through-hole groups b includes a plurality of first strip through-holes b1, and the first strip through-holes b1 of two adjacent first through-hole groups b are interleaved.

The through-holes in the second unidirectional support region 1014b2 include a plurality of second strip through-holes cl extending along a second direction Y. The plurality of second strip through-holes cl constitute a plurality of second through-hole groups c arranged in the first direction X. Each of the second through-hole groups c includes a plurality of second strip through-holes cl, and the second strip through-holes cl of two adjacent second through-hole groups c are interleaved.

The target structure of the bidirectional support region 1014b3 includes at least a plurality of circular holes A. Each circular hole A and at least one first through-hole group b are arranged along the first direction X, and the circular hole A and at least one second through-hole group c are arranged along a second direction Y.

In some embodiments, the embodiments of the present disclosure do not specifically limit the quantity of round holes A designed in the bidirectional support region 101$b$3, but only make the quantity of round holes A designed in the dual support region 101$b$3 capable of balancing the support performance and the bending performance of the bidirectional support region 101$b$3 thereof. The support performance of the bidirectional support region 101$b$3 is negatively related to the quantity of round holes designed in the bidirectional support region 101$b$3, and the bending performance of the bidirectional support region 101$b$3 is positively related to the quantity of round holes designed in the bidirectional support region 101$b$3.

That is, the greater the quantity of circular holes designed in the bidirectional support region 101$b$3, the worse the support performance and the better the bending performance. The less the quantity of circular holes designed in the bidirectional support region 101$b$3, the better the support performance and the worse the bending performance.

Figure 19:
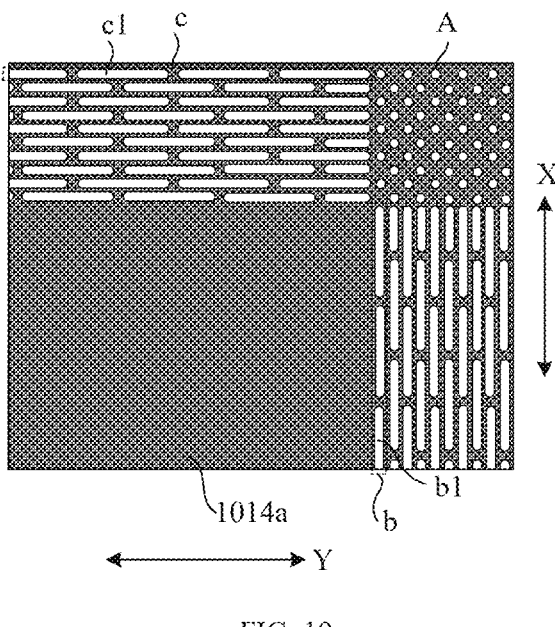
FIG. 19 is a top view of another support plate according to some embodiments of the present disclosure.
Figure 20:
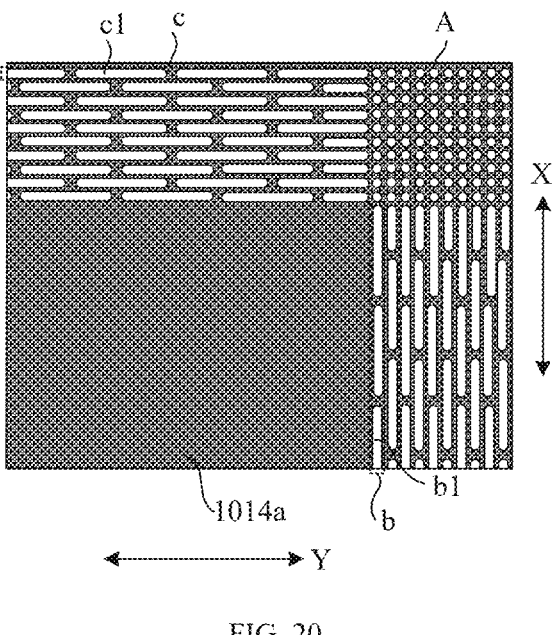
FIG. 20 is a top view of still another support plate according to some embodiments of the present disclosure.

Referring to FIG. 19, the plurality of circular holes A in the bidirectional support region 101$b$3 are arrayed. Referring to FIG. 20, the plurality of circular holes A in the bidirectional support region 101$b$3 are arranged in an array. The row density (row density is configured to measure the quantity of circular holes per unit region) of the circular holes A in the bidirectional support region 101$b$3 shown in FIG. 20 is greater than the row density of the circular holes A in the bidirectional support region 101$b$3 shown in FIG. 19. As a result, the bending performance of the bidirectional support region 101$b$3 shown in FIG. 20 is superior to the bending performance of the bidirectional support region 101$b$3 shown in FIG. 19, and the support performance of the bidirectional support region 101$b$3 shown in FIG. 19 is superior to the support performance of the bidirectional support region 101$b$3 shown in FIG. 20.

In the embodiments of the present disclosure, the first unidirectional bendable display region 101$a$1 of the display module 101 can be bent along the first direction X. Because the plurality of first strip through-holes $b$1 in the first unidirectional support region 1014$b$1 supporting the first unidirectional bendable display region 101$a$1 are extended along the first direction X, the bending stress of the first unidirectional support region 1014$b$1 can be reduced and the yield of the display module 101 can be ensured.

In addition, because the through-holes in the bidirectional support region 101463 include circular holes, the display module 101 can well adapt to and withstand the alternating stresses caused by the two directions during the bidirectional bending process, thereby avoiding phenomena such as debonding of the film layer or fracture of the display module 101, and improving the yield rate and reliability of the display module 101.

Figure 21:
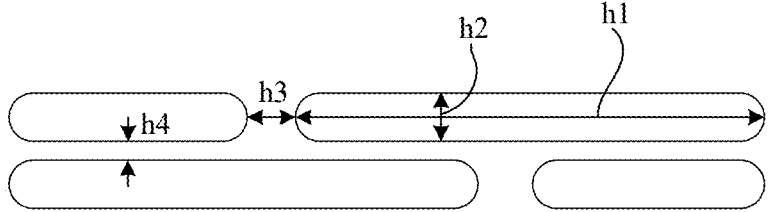
FIG. 21 is a schematic view of a strip through-hole according to some embodiments of the present disclosure.

In some embodiments, with reference to FIG. 21, for the strip through-holes in the first unidirectional support region 1014$b$1 and the second unidirectional support region 1014$b$2, the length of the strip through-hole along the extension direction thereof, h1, ranges from 3 mm to 6 mm, such as 3.5 mm, 4 mm, 4.5 mm, 5 mm, or 5.5 mm. The width of the strip through-hole, h2, ranges from 0.1 mm to 0.2 mm, such as 0.12 mm, 0.14 mm, 0.15 mm, 0.16 mm or 0.18 mm. The distance of the gap h3 between two adjacent strip through-holes in the extension direction thereof ranges from 0.1 mm to 0.3 mm, such as 0.15 mm, 0.2 mm or 0.25 mm. The distance of the gap h4 between two adjacent strip through-holes in the width direction thereof ranges from 0.1 mm to 0.2 mm, such as 0.12 mm, 0.14 mm, 0.15 mm, 0.16 mm or 0.18 mm. Alternatively, the diameter of the circular hole of the bidirectional support region 1014$b$3 is equal to the width of the strip through-hole.

In the embodiments of the present disclosure, the longer the length h1 of the strip through-hole along the extension direction thereof is, the better the bending performance of the support region is, but the worse the support performance is. The shorter the length h1 of the strip through-hole along the extension direction thereof is, the worse the bending performance of the support region is, but the better the support performance is. In addition, the smaller the width h2 of the strip through-hole is, the corresponding gap h3 of the strip through-hole in the extension direction and the gap h4 in the width direction can be reduced accordingly. As a result, the density of the rows of strip through-holes arranged in the support region can be increased, and the bending performance of the support region can be improved.

It should be noted that for the strip through-holes in the embodiments of the present disclosure can be designed based on the need for bending performance and support performance, and the selection of the individual dimensions can be simulated and designed.

In some embodiments, referring to FIGS. 19 and 20, the first strip through-hole b1 and the second strip through-hole cl are both designed with rounded chamfers at both ends of their extension directions, and the first strip through-hole b1 in the two adjacent first through-hole sets b are interleaved, and the second strip through-hole cl in the two adjacent second through-hole sets c are interleaved, and thus the bending stresses can be effectively released, while providing sufficient support strength.

Figure 22:
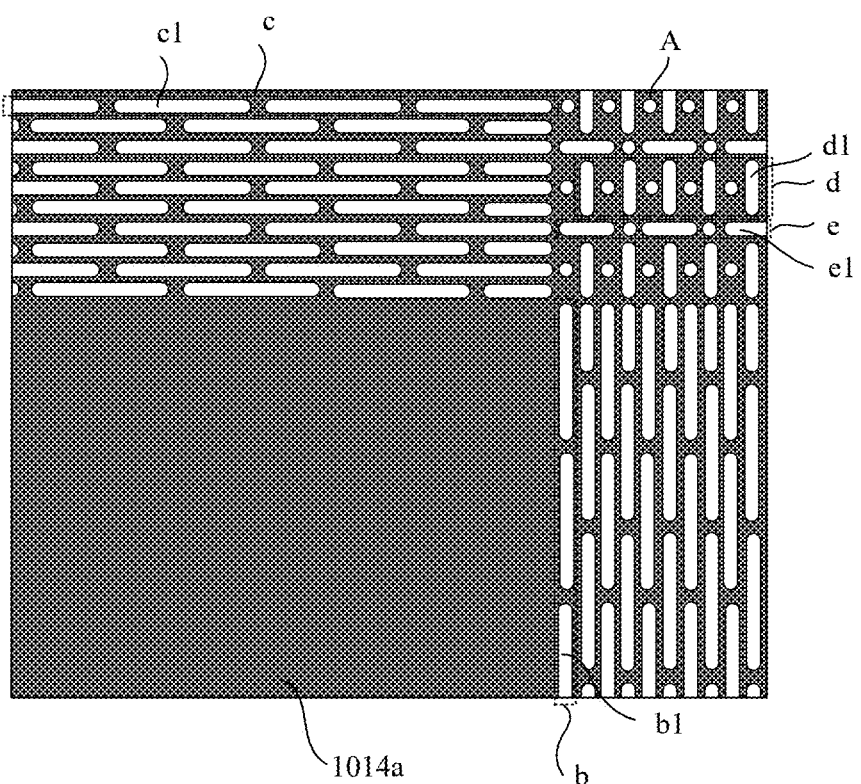
FIG. 22 is a top view of still another support plate according to some embodiments of the present disclosure.

In some embodiments, referring to FIG. 22, the through-holes of the bidirectional support region 1014$b$3 further include a plurality of third through-hole groups d and a plurality of fourth through-hole groups e. The plurality of third through-hole groups d and the plurality of fourth through-hole groups e are interleaved in the second direction Y. The plurality of third through-hole groups e are interleaved in the second direction Y.

The third through-hole group d includes a plurality of third strip through-holes d1 arranged along the second direction Y and extending along the first direction X. A length of the third strip through-hole d1 along the first direction X is equal to the sum of widths h2 of m second through-holes cl and widths h4 of gap widths h4 between m−1 adjacent second through-hole groups c. The m is a positive integer greater than or equal to 2. The third through-hole group d is arranged along the first direction X with the first through-hole group b.

In some embodiments, assuming that m is equal to 3, the length L1 of each third strip through-hole d1 along the first direction X is equal to the sum of the widths h2 of the three second through-holes cl and the widths h4 of the gaps between the two adjacent second through-hole groups c, i.e., L1=3×h2+2×h4.

The fourth through-hole group e includes a plurality of fourth strip through-holes e1 arranged in the second direction Y and extending in the second direction Y. A length of the fourth strip through-hole e1 in the second direction Y is equal to the sum of widths h2 of n first strip through-holes b1 and gap widths h4 between n−1 adjacent first through-hole groups b. The n is a positive integer greater than or equal to 2. The fourth through-hole group e is arranged along the second direction Y with the second through-hole group c. The fourth through-hole group e is arranged along the second direction Y with the second through-hole group c.

In some embodiments, assuming n is equal to 3, the length L2 of each fourth strip through-hole e1 along the second direction Y is equal to the sum of the width h2 of the three first strip through-holes b1 and the widths h4 of the gap widths h4 between the two adjacent second through-hole groups b, i.e., L2=3×h2+2×h4.

Because the bidirectional support region 1014b3 requires the ability to bend in two directions, by designing the third strip through-hole d1 and the fourth strip through-hole e1 in the bidirectional support region 1014b3, the display module 101 can further be made to well adapt to and withstand the alternating stress caused by the two directions in the bidirectional bending process, avoiding that the film layer of the display module 101 becomes de-sticking or further avoiding the phenomenon of film layer debonding or fracture during the bending process of the display module 101, ensuring the yield and reliability of the display module 101.

In some embodiments of the present disclosure, in the case that the bidirectional support region 1014b3 includes a circular hole, a third strip through-hole d1, and a fourth strip through-hole e1, the circular hole is designed in the gap between two adjacent third strip through-holes d1, and/or in the gap between two adjacent fourth strip through-holes e1. The overall modulus of the bendable display region 101a of the display module 101 can be reduced by this design.

In some embodiments, the third bar through-hole d1 and the fourth bar through-hole e1 is also designed with rounded chamfers at the ends of their extension directions.

Figure 23:
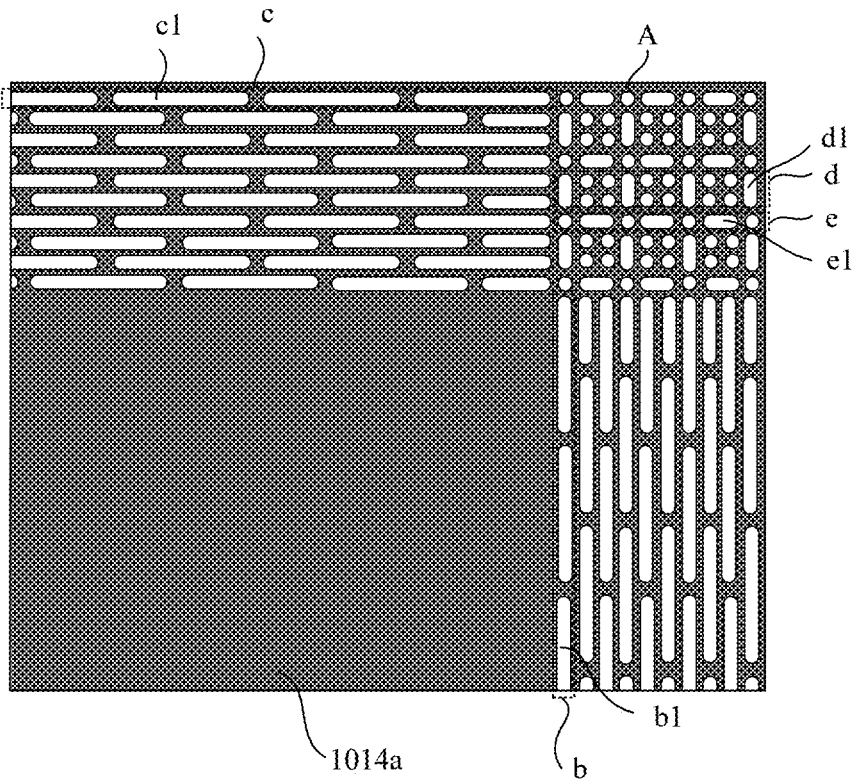
FIG. 23 is a top view of still another support plate according to some embodiments of the present disclosure.

Referring to FIG. 23, in the through-holes of the bidirectional support region 1014b3, 2 rows and 2 columns of circular through-holes A are disposed between two adjacent third strip through-holes d1 in the third through-hole group d. The fourth strip through-holes e1 in the fourth through-hole group e have one circular through-hole A between two adjacent fourth strip through-holes e1. In FIG. 23, a length L1 of the third strip through-hole d1 in the third through-hole group d in the first direction X is equal to 2 widths h2 of the second strip through-holes c1 and the sum of the gap widths h4 between 1 adjacent second through-hole groups c, i.e., L1=2×h2+1×h4. The length L2 of the fourth strip through-hole e1 in the fourth through-hole groups e in the second direction Y is equal to the sum of the widths h2 of the two first strip through-holes b1 and the gap widths h4 between 1 adjacent first through-hole groups b, i.e., L2=2× h2+1× h4.

In the implementation shown in FIGS. 19 to 20 and FIGS. 22 to 23, the bendable display region 101a is an L-shaped region, the region overlapped with the L-shaped region is the bidirectional bendable display region 101a3, whereby the display module 101 is bent in a "C" shape.

Figure 24:
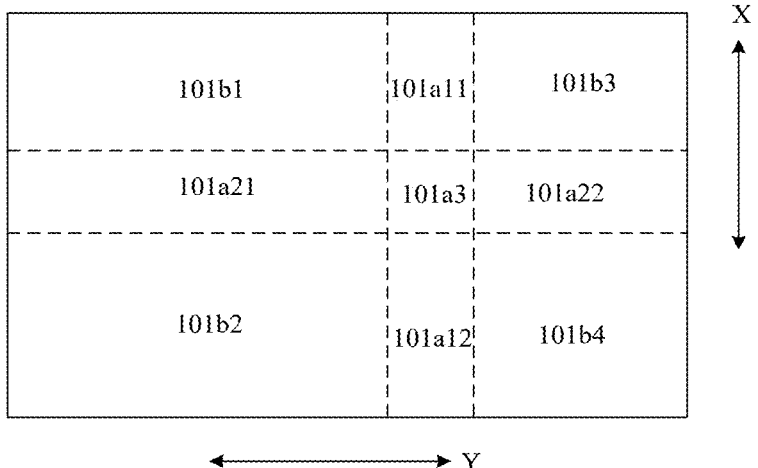
FIG. 24 is a top view of still another display module according to some embodiments of the present disclosure.

Referring to FIG. 24, the first unidirectional bendable display region 101a1 includes a first unidirectional sub-display region 101a11 and a second unidirectional sub-display region 101a12, and the second unidirectional bendable display region 101a2 includes a third unidirectional sub-display region 101a21 and a fourth unidirectional sub-display region 101a22.

The first unidirectional sub-display region 101a11 and the second unidirectional sub-display region 101a12 are respectively disposed on both sides of the bidirectional bendable display region 101a3 in the first direction X, and the third unidirectional sub-display region 101a21 and the fourth unidirectional sub-display region 101a22 are respectively disposed on both sides of the bidirectional bendable display region 101a3 in the second direction Y.

Figure 25:
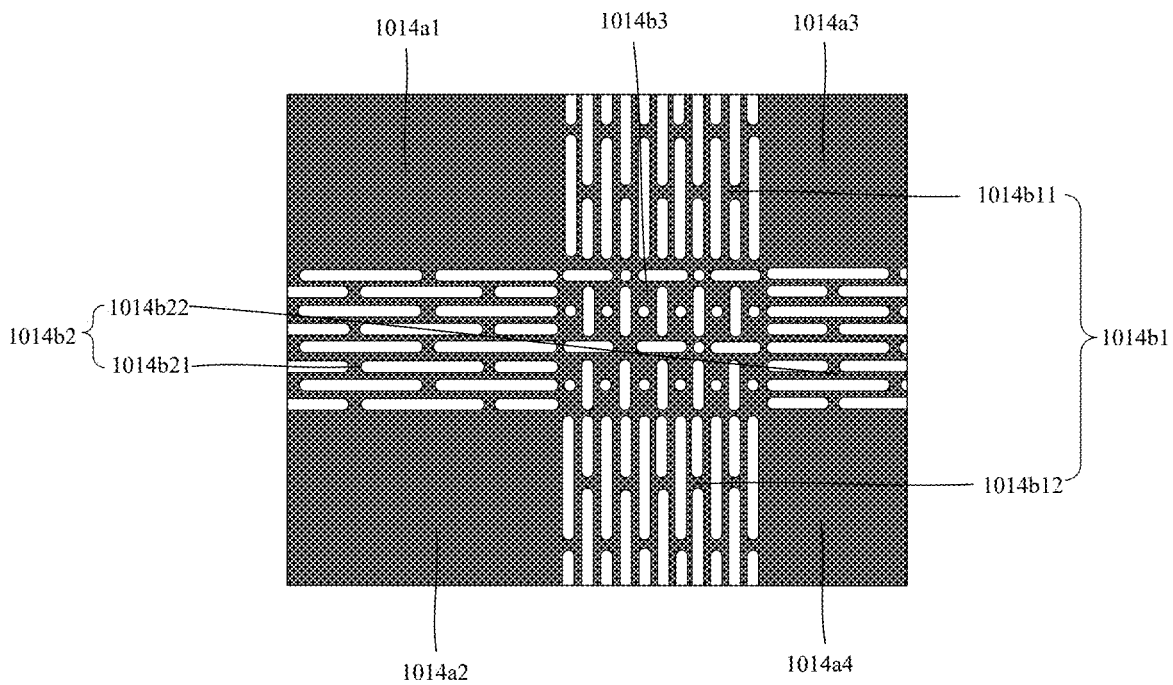
FIG. 25 is a top view of still another support plate according to some embodiments of the present disclosure.

Accordingly, referring to FIG. 25, the first unidirectional support region 1014b1 includes a first unidirectional sub-support region 1014b11 and a second unidirectional sub-support region 1014b12, and the second unidirectional support region 1014b2 includes a third unidirectional sub-support region 1014b21 and a fourth unidirectional sub-support region 1014b22.

The first unidirectional sub-support region 1014b11 and the second unidirectional sub-support region 1014b12 are respectively disposed on both sides of the bidirectional support region 1014b3 in the first direction X. The third unidirectional sub-support region 1014b21 and the fourth unidirectional sub-support region 1014b22 are respectively disposed on both sides of the bidirectional support region 1014b3 in the second direction Y.

In some embodiments of the present disclosure, the planar display region 101b includes a first sub-planar display region 101b1, a second sub-planar display region 101b2, a third sub-planar display region 101b3, and a fourth sub-planar display region 101b4. The first sub-planar display region 101b1 and the second sub-planar display region 101b2 are respectively disposed on both sides of the third unidirectional sub-display region 101a21, the third sub planar display region 101b3 and the fourth sub-planar display region 101b4 are respectively disposed on both sides of the fourth unidirectional sub-planar display region 101a22. The first sub-planar display region 101b1 and the third sub-planar display region 101b3 are respectively disposed on both sides of the first unidirectional sub-display region 101a11, and the second sub-planar display region 101b2 and the fourth sub-planar display region 101b4 are respectively disposed on both sides of the second unidirectional sub-display region 101a12.

Accordingly, the first support region 1014a includes a first sub-support region 1014a1, a second sub-support region 1014a2, a third sub-support region 1014a3, and a fourth sub-support region 1014a4. The first sub-support region 1014a1 and the second sub-support region 1014a2 are respectively disposed on both sides of the third unidirectional sub-support region 1014b21, and the third sub-support region 1014a3 and the fourth sub-support region 1014a4 are respectively disposed on both sides of the fourth unidirectional sub-support region 1014b22. The first sub-support region 1014a1 and the third sub-support region 1014a3 are respectively disposed on both sides of the first unidirectional sub-support region 1014b11, and the second sub-support region 1014a2 and the fourth sub-support region 1014a4 are respectively disposed on both sides of the second unidirectional sub-support region 1014b12.

In the implementation shown in FIG. 24, the bendable display region 101a is a cross region, and the overlapped region within the crosses region is the bidirectionally bendable display region 101a3. In this way, the display module 101 is bent in an "L" shape.

Referring to FIG. 16, it can be seen that the display module 101 further includes an optical clear adhesive (OCA) 1015, a polarizer (POL) 1016, and a back film (BF) 1017. The OCA 1015 and the POL 1016 are disposed between the cover glass 1012 and the display panel 1011, and the OCA 1015 is disposed distal from the display panel 1011 with respect to the POL 1016, the POL 1016 is configured to adjust the polarization direction of the light emitted from the display panel 1011, and the OCA 1015 is configured to bond the cover glass 1012 and the POL 1016. The back film 1017 is disposed between the display panel 1011 and the support plate 1014, and is configured to protect the non-display surface of the display panel 1011.

In embodiments of the present disclosure, the thickness of the cover glass 1012 is determined based on a user's need for surface hardness of the cover glass 1012. Typically, the thicker the thickness of the cover 1012 is, the higher the hardness is, the thinner the thickness of the cover 1012 is, the lower the hardness is.

In the case that the display device is applied to a vehicle folding display (e.g., a center control display of a vehicle), the display device does not require to be completely folded (the user cannot view in a completely folded situation), but at most requires to be folded to 90 degrees. The thickness of the cover glass 1012 in the display device is made to be appropriately thickened in order to increase the hardness of its surface and its compression strength.

In some embodiments, the cover glass 1012 of the display module 101 is an ultra-thin glass, or a clear polyimide, or a combination of ultra-thin glass and clear polyimide (CPI). The thickness of the ultra-thin glass ranges from 0.03 mm to 0.7 mm, such as from 0.1 mm to 0.2 mm. The thinner the thickness of the ultra-thin glass is, the worse the support performance is, the thicker the thickness of the ultra-thin glass is, the worse the bending performance is. Therefore, the present disclosure prefers an ultra-thin glass with a thickness of 0.1 mm to 0.2 mm, which not only can play a certain supporting role for the display panel 1011, but also can have superior bending performance. The thickness of the transparent polyimide ranges from 0.05 mm to 0.3 mm, such as 0.1 mm, 0.15 mm, 0.2 mm or 0.25 mm.

In the case that the display device is an ordinary folded display device, the display device requires to be completely folded, and the thickness of the cover glass 1012 is made thinner in order to reduce the bending stress. For example, the thickness of the cover glass 1012 ranges from 0.03 mm to 0.05 mm, such as 0.04 mm.

In some embodiments of the present disclosure, the display panel 1011 is a flexible display panel, thereby realizing the bending of the display device 10. For example, the display panel 1011 is an organic light-emitting diode (OLED) display panel.

In summary, embodiments of the present disclosure provide a display device including the display module, the encapsulation housing, and at least one support assembly. The support assembly includes the first retractable linkage and the first drive motor. The first end and the second end of the first retractable linkage are connected to the encapsulation housing and a non-display side of the display module respectively. The first drive motor is capable of automatically driving the first retractable linkage to extend or retract, thereby realizing automatic bending or flattening of the bendable display region of the display module, and the display device has high flexibility in use.

Figure 26:
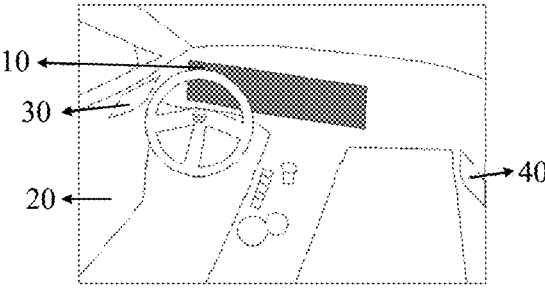
FIG. 26 is a schematic view of a structure of a vehicle according to some embodiments of the present disclosure.

FIG. 26 is a partial schematic diagram of a vehicle according to some embodiments of the present disclosure. Referring to FIG. 26, it can be seen that the vehicle includes a body 20 and a display device 10 disposed within the body 20 as described in the above embodiments. The display device 10 is a center control display of the vehicle, or an instrumentation display of the vehicle, or a display in which the instrumentation and the center control are integrated.

Figure 27:
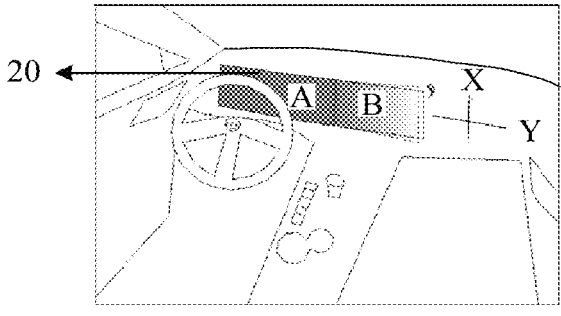
FIG. 27 is a schematic view of the structure of another vehicle according to some embodiments of the present disclosure.

Referring to FIG. 27, in the case that region B is displayed as a bendable surface, the content displayed by the center control display can be bent towards the main driving region, such that it is easy for the driver to observe the display screen of the center control display.

In addition, the vehicle also includes a left rearview mirror 30 and a right rearview mirror 40. The left rearview mirror 30 and right rearview mirror 40 are electronic mirrors. In this way, the display content of the right electronic rearview mirror 40 can also be projected in the center control display screen based on the driver's preference, such that the driver can observe the right driving screen of the vehicle when observing the center control display screen, which reduces the viewing angle of observing the right rearview mirror. Further, more reaction time can be provided to the driver to improve driving safety.

Figure 28:
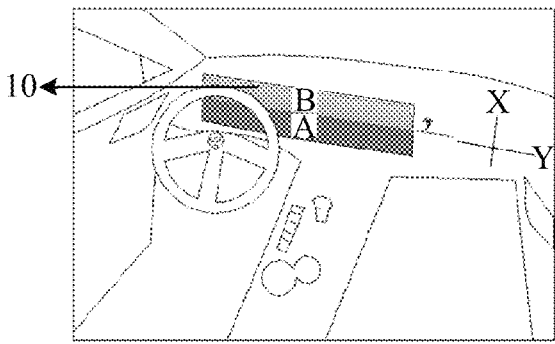
FIG. 28 is a schematic view of the structure of still another vehicle according to some embodiments of the present disclosure.

The center display can also be bent along the X-axis with the Y-axis as the bending axis. As shown in FIG. 28, region A is a flat display region and region B is a bendable display region, the curvature of region B can be adjusted arbitrarily in the same way as FIG. 27. The driver can adjust the curvature of the upper part of the center display according to his/her own viewpoint, and the curvature of the X-axis direction and Y-axis direction are not carried out simultaneously, and the operation can be switched. The basic transformation process is, planar display, bending along the Y-axis, planar display, and bending along the X-axis, and vice versa.

Because the vehicle has essentially the same technical effect as the display device described in the preceding embodiments, the technical effect of the vehicle is not repeated herein for the purpose of brevity.

It should be appreciated that although the terms first and second, etc. is used herein to describe various elements, components, regions, layers and/or portions, these elements, components, regions, layers and/or portions should not be limited by these terms. These terms are only configured to distinguish one element, component, region, layer, or portion from another region, layer, or portion. Thus, the first element, component, region, layer, or portion discussed above is referred to as a second element, component, region, layer, or portion without departing from the teachings of the present disclosure.

Spatially relative terms such as "under," "over," "left," "right," and the like are used herein for ease of description to describe the relationship of one element or feature to another element or feature(s) as illustrated in the figures. It should be understood that these spatially relative terms are intended to encompass different orientations of the device in use or operation in addition to the orientation depicted in the figure. For example, in the case that the device in the figure is flipped, then a component described as "under another component or feature" is oriented as "on another component or feature". Thus, the exemplary term "under" encompasses both an orientation over and an orientation under. The device is oriented in other ways (rotated 90 degrees or in other orientations) and the spatially relative descriptors used herein are interpreted accordingly. It should be understood that when a layer is referred to as "between two layers", it is the only layer between the two layers, or there is one or more intermediate layers.

The terminology used herein is for the purpose of describing particular embodiments only and is not intended to limit the present disclosure. As used herein, the singular forms "a," "one," and "the" are intended to include the plural form as well, unless the context clearly indicates otherwise. It should be further understood that the terms "including" and/or "including" when used in this specification designate the presence of the described feature, whole, step, operation, element and/or component, but do not exclude one or more other features, wholes, steps, operations, components, parts and/or groups thereof, elements, components, parts, and/or groups thereof from existing or adding one or more other features, wholes, steps, operations, elements, parts, and/or groups thereof. As used herein, the term "and/or" includes any and all combinations of one or more of the associated listed items. In this specification, specific features, structures, materials, or characteristics described is combined in any one or more embodiments or examples in a suitable manner. In addition, without contradicting each other, those skilled in the art can combine and combine different embodiments or examples and features of different embodiments or examples described in this specification.

Unless otherwise defined, all terms used herein (including technical and scientific terms) have the same meaning as commonly understood by those of ordinary skill in the art to which this disclosure belongs. It should be further understood that terms such as those defined in commonly used dictionaries should be construed as having a meaning consistent with their meaning in the relevant field and/or context of this specification and is not construed in an idealized or overly formal sense unless expressly so defined herein.

The foregoing are only optional embodiments of this application and are not intended to limit this application, and any modifications, equivalent substitutions, improvements, etc. made within the spirit and principles of this application shall be included in the scope of protection of this application.

What is claimed is:

1. A display device, comprising:

a display module, having a bendable display region and a planar display region;

an encapsulation housing, disposed on a non-display side of the display module, wherein a receiving chamber is formed between the encapsulation housing and the non-display side of the display module; and at least one support assembly, disposed in the receiving chamber, wherein the support assembly at least comprises a first retractable linkage and a first drive motor, a first end of the first retractable linkage is connected to the encapsulation housing, and a second end of the first retractable linkage is connected to the non-display side of the display module;

wherein the first drive motor is configured to drive the first retractable linkage to extend or retract, the first retractable linkage is extended to drive the bendable display region of the display module to bend, and the first retractable linkage is retracted to drive the bendable display region of the display module to flatten, wherein the support assembly further comprises a second retractable linkage and a second drive motor; wherein a first end of the second retractable linkage is connected to the encapsulation housing, and a gap is defined between a second connection position of the second retractable linkage and the encapsulation housing, and a first connection position of the first retractable linkage and the encapsulation housing;

a second end of the second retractable linkage is connected to a target position of the first retractable linkage, the target position is between the first end and the second end of the first retractable linkage, and the target position is closer to the second end of the first retractable linkage with respect to the first end of the first retractable linkage; and the second drive motor is configured to drive the second retractable linkage to extend or retract, the second retractable linkage is extended to support the first retractable linkage, and the second retractable linkage is retracted to drive the bendable display region of the display module to flatten.

2. The display device according to claim 1, wherein the first retractable linkage comprises a first moving portion and a second moving portion;

wherein the first drive motor is fixedly connected to the first moving portion, and the first drive motor is configured to drive the first moving portion and the second moving portion to move relative to each other.

3. The display device according to claim 2, wherein the first moving portion comprises a rod structure having a first connection thread, and the second moving portion comprises a tube structure having a strip connection groove, an extension direction of the connection groove is parallel to a length direction of the tube structure, and a second connection thread is disposed on a sidewall of the connection groove;

wherein the first drive motor is configured to adjust a screw length at which the first connection thread of the first moving portion is screwed with the second connection thread of the second moving portion.

4. The display device according to claim 1, wherein the support assembly further comprises a third retractable linkage, a third drive motor, a support linkage, and a slideway; wherein a first end of the third retractable linkage is connected to the first end of the first retractable linkage;

the slideway is fixedly connected to the encapsulation housing, and an extension direction of the slideway is parallel to a plane where the planar display region of the display module is disposed, and a second end of the third retractable linkage is disposed in the slideway and is connected to a first end of the support linkage;

a second end of the support linkage is connected to a target position of the first retractable linkage, the target position is between the first end and the second end of the first retractable linkage, and the target position is closer to the second end of the first retractable linkage relative to the first end of the first retractable linkage; and the third drive motor is configured to drive the third retractable linkage to extend or retract within the slideway, wherein the third retractable linkage is extended to cause the support linkage to support the first retractable linkage, and the third retractable linkage is retracted to drive the bendable display region of the display module to flatten.

5. The display device according to claim 1, wherein the support assembly further comprises a first gear, a second gear, and a fourth drive motor; wherein the first gear is connected to a first end of the encapsulation housing and the first retractable linkage, and relative positions of the first gear and the first retractable linkage are fixed;

the second gear is connected to the encapsulation housing, and the second gear and the first gear are engaged with each other; and the fourth drive motor is configured to drive the first gear to rotate by driving the second gear to rotate, such that an angle of rotation of the first retractable linkage connected to the first gear relative to a plane where the planar display region of the display module is disposed is adjusted.

6. The display device according to claim 1, wherein at least a first boundary extending along a first direction is disposed between the bendable display region and the planar display region of the display module, the at least one support assembly further comprises two first support assemblies, and the display device further comprises a first connection member;

wherein the first connection member extends along the first direction, the first connection member is connected to the non-display side of the display module, and a gap is defined between the two first support assemblies in the first direction, and the two first support assemblies are connected to the first connection member.

7. The display device according to claim 6, wherein at least a second boundary extending along a second direction is disposed between the bendable display region and the planar display region of the display module, the second direction is intersected with the first direction, the at least one support assembly further comprises two second support assemblies, and the display device further comprises a second connection member;

wherein the second connection member extends along the second direction, the second connection member is connected to the non-display side of the display module, and a gap is defined between the two second support assemblies in the second direction, and the two second support assemblies are connected to the second connection member.

8. The display device according to claim 1, wherein the display module at least comprises:

a display panel, having a display surface and a non-display surface;

a cover glass, disposed on the display surface of the display panel for protecting the display surface; and a module housing, having a first portion and a second portion, wherein the first portion is disposed on a side wall of the display panel and connected to the cover glass, and the second portion is disposed on a non-display surface of the display panel;

wherein the second end of the first retractable linkage is connected to the second portion of the module housing.

9. The display device according to claim 8, wherein the display module further comprises a support plate; wherein the support plate at least has a first support region and a second support region, the first support region is within the planar display region, and the second support region is within the bendable display region; and a portion of the support plate disposed in the first support region is a solid structure, and a portion of the support plate disposed in the second support region has a target structure, a thickness of the target structure being less than a thickness of the support plate.

10. The display device according to claim 9, wherein the bendable display region of the display module comprises a first unidirectional bendable display region, a second unidirectional bendable display region, and a bidirectional bendable display region; wherein the first unidirectional bendable display region is a strip region extending along a first direction, the second unidirectional bendable display region is a strip region extending along a second direction, the second direction is intersected with the first direction, the bidirectional bendable display region and the first unidirectional bendable display region are arranged along the first direction, and the bidirectional bendable display region and the second unidirectional bendable display region are arranged along the second direction; and the second support region of the support plate comprises a first unidirectional support region, a second unidirectional support region, and a bidirectional support region, the first unidirectional support region is within the first unidirectional bendable display region, the second unidirectional support region is within the second unidirectional bendable display region, and the bidirectional support region is within the bidirectional bendable display region;

wherein through-holes in the first unidirectional support region comprise a plurality of first strip through-holes extending along the first direction, the plurality of first strip through-holes constitute a plurality of first through-hole groups arranged in a second direction, each of the first through-hole groups comprises a plurality of first strip through-holes, and the first strip through-holes of two adjacent first through-hole groups are interleaved;

through-holes in the second unidirectional support region comprises a plurality of second strip through-holes extending along the second direction, the plurality of second strip through-holes constitute a plurality of second through-hole groups arranged in a first direction, each of the second through-hole groups comprises a plurality of second strip through-holes, the second strip through-holes of two adjacent second through-hole groups are interleaved; and through-holes of the bidirectional support region at least comprises a plurality of circular holes, the circular hole and at least one first through-hole group are arranged along the first direction, and the circular hole and at least one second through-hole group are arranged along the second direction.

11. The display device according to claim 10, wherein the through-holes of the bidirectional support region further comprise a plurality of third through-hole groups and a plurality of fourth through-hole groups, the plurality of third through-hole groups and the plurality of fourth through-hole groups are interleaved along the second direction; wherein the third through-hole group comprises a plurality of third strip through-holes arranged in the second direction and extending in the first direction, a length of the third strip through-hole in the first direction is equal to a sum of widths of m second strip through-holes and gap widths between m−1 adjacent second through-hole groups, m is a positive integer greater than or equal to 2, and the third through-hole group is arranged along the second direction with the first through-hole group; and the fourth through-hole group comprises a plurality of fourth strip through-holes arranged in the second direction and extending in the second direction, a length of the fourth strip through-hole in the second direction is equal to a sum of the widths of n first strip through-holes and gap widths between n−1 adjacent first through-hole groups, n is a positive integer greater than or equal to 2, and the fourth through-hole groups are arranged along the second direction with the second through-hole groups.

12. The display device according to claim 10, wherein the first unidirectional bendable display region comprises a first unidirectional sub-display region and a second unidirectional sub-display region, and the second unidirectional bendable display region comprises a third unidirectional sub-display region and a fourth unidirectional sub-display region; wherein the first unidirectional sub-display region and the second unidirectional sub-display region are respectively disposed on both sides of the bidirectional bendable display region in the first direction, and the third unidirectional sub-display region and the fourth unidirectional sub-display region are respectively disposed on both sides of the bidirectional bendable display region in the second direction;

the first unidirectional support region comprises a first unidirectional sub-support region and a second unidirectional sub-support region, and the second unidirectional support region comprises a third unidirectional sub-support region and a fourth unidirectional sub-support region; and the first unidirectional sub-support region and the second unidirectional sub-support region are respectively disposed on both sides of the bidirectional support region in the first direction, and the third unidirectional sub-support region and the fourth unidirectional sub-support region are respectively disposed on both sides of the bidirectional support region in the second direction.

13. The display device according to claim 12, wherein the planar display region comprises a first sub-planar display region, a second sub-planar display region, a third sub-planar display region, and a fourth sub-planar display region; wherein the first sub-planar display region and the second sub-planar display region are respectively disposed on both sides of the third unidirectional sub-planar display region, the third sub-planar display region and the fourth sub-planar display region are respectively disposed on both sides of the fourth unidirectional sub-planar display region, and the first sub-planar display region and the third sub-planar display region are respectively disposed on both sides of the first unidirectional sub-planar display region, the second sub-planar display region and the fourth sub-planar display region are respectively disposed on both sides of the second unidirectional sub-display region;

the first support region comprising a first sub-support region, a second sub-support region, a third sub-support region, and a fourth sub-support region; and the first sub-support region and the second sub-support region are respectively disposed on both sides of the third unidirectional sub-support region, the third sub-support region and the fourth sub-support region are respectively disposed on both sides of the fourth unidirectional sub-support region, the first sub-support region and the third sub-support region are respectively disposed on both sides of the first unidirectional sub-support region, and the second sub-support region and the fourth sub-support region are respectively disposed on both sides of the second unidirectional sub-support region.

14. A vehicle, comprising: a body, and a display device disposed within the body, wherein the display device comprises:

a display module, having a bendable display region and a planar display region;

an encapsulation housing, disposed on a non-display side of the display module, wherein a receiving chamber is formed between the encapsulation housing and the non-display side of the display module; and at least one support assembly, disposed in the receiving chamber, wherein the support assembly at least comprises a first retractable linkage and a first drive motor, a first end of the first retractable linkage is connected to the encapsulation housing, and a second end of the first retractable linkage is connected to the non-display side of the display module;

wherein the first drive motor is configured to drive the first retractable linkage to extend or retract, the first retractable linkage is extended to drive the bendable display region of the display module to bend, and the first retractable linkage is retracted to drive the bendable display region of the display module to flatten, wherein the support assembly further comprises a second retractable linkage and a second drive motor; wherein a first end of the second retractable linkage is connected to the encapsulation housing, and a gap is defined between a second connection position of the second retractable linkage and the encapsulation housing, and a first connection position of the first retractable linkage and the encapsulation housing;

a second end of the second retractable linkage is connected to a target position of the first retractable linkage, the target position is between the first end and the second end of the first retractable linkage, and the target position is closer to the second end of the first retractable linkage with respect to the first end of the first retractable linkage; and the second drive motor is configured to drive the second retractable linkage to extend or retract, the second retractable linkage is extended to support the first retractable linkage, and the second retractable linkage is retracted to drive the bendable display region of the display module to flatten.

15. The vehicle according to claim 14, wherein the first retractable linkage comprises a first moving portion and a second moving portion;

wherein the first drive motor is fixedly connected to the first moving portion, and the first drive motor is configured to drive the first moving portion and the second moving portion to move relative to each other.

16. The vehicle according to claim 15, wherein the first moving portion comprises a rod structure having a first connection thread, and the second moving portion comprises a tube structure having a strip connection groove, an extension direction of the connection groove is parallel to a length direction of the tube structure, and a second connection thread is disposed on a sidewall of the connection groove;

wherein the first drive motor is configured to adjust a screw length at which the first connection thread of the first moving portion is screwed with the second connection thread of the second moving portion.

17. The vehicle according to claim 14, wherein the support assembly further comprises a third retractable linkage, a third drive motor, a support linkage, and a slideway; wherein a first end of the third retractable linkage is connected to the first end of the first retractable linkage;

the slideway is fixedly connected to the encapsulation housing, and an extension direction of the slideway is parallel to a plane where the planar display region of the display module is disposed, and a second end of the third retractable linkage is disposed in the slideway and is connected to a first end of the support linkage;

a second end of the support linkage is connected to a target position of the first retractable linkage, the target position is between the first end and the second end of the first retractable linkage, and the target position is closer to the second end of the first retractable linkage relative to the first end of the first retractable linkage; and the third drive motor is configured to drive the third retractable linkage to extend or retract within the slideway, wherein the third retractable linkage is extended to cause the support linkage to support the first retractable linkage, and the third retractable linkage is retracted to drive the bendable display region of the display module to flatten.

18. The vehicle according to claim 14, wherein the support assembly further comprises a first gear, a second gear, and a fourth drive motor; wherein the first gear is connected to a first end of the encapsulation housing and the first retractable linkage, and relative positions of the first gear and the first retractable linkage are fixed;

the second gear is connected to the encapsulation housing, and the second gear and the first gear are engaged with each other; and the fourth drive motor is configured to drive the first gear to rotate by driving the second gear to rotate, such that an angle of rotation of the first retractable linkage connected to the first gear relative to a plane where the planar display region of the display module is disposed is adjusted.

\* \* \* \* \*